(12) United States Patent
Kang et al.

(10) Patent No.: US 8,053,829 B2
(45) Date of Patent: Nov. 8, 2011

(54) METHODS OF FABRICATING NONVOLATILE MEMORY DEVICES

(75) Inventors: Pil-Kyu Kang, Gyeonggi-do (KR);
 Daelok Bae, Seoul (KR); Jongwook Lee, Gyeonggi-do (KR); Seungwoo Choi, Seoul (KR); Yong-Hoon Son, Gyeonggi-do (KR); Jong-Hyuk Kang, Gyeonggi-do (KR); Jung Ho Kim, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 47 days.

(21) Appl. No.: 12/635,098

(22) Filed: Dec. 10, 2009

(65) Prior Publication Data

US 2010/0140685 A1    Jun. 10, 2010

(30) Foreign Application Priority Data

Dec. 10, 2008  (KR) .................. 10-2008-0125251

(51) Int. Cl.
  *H01L 29/792*  (2006.01)
(52) U.S. Cl. ... 257/326; 257/390; 257/324; 257/E27.06; 257/E21.606
(58) Field of Classification Search .............. 438/258, 438/266; 257/326, 390, E27.06, E21.607; 365/185.05
See application file for complete search history.

(56) References Cited

U.S. PATENT DOCUMENTS

| 7,704,832 | B2* | 4/2010 | Kai et al. ................ 438/258 |
| 2007/0252201 | A1 | 11/2007 | Kito et al. | |
| 2010/0140666 | A1* | 6/2010 | Yoon ........................ 257/210 |

* cited by examiner

*Primary Examiner* — Tu-Tu Ho
(74) *Attorney, Agent, or Firm* — Myers Bigel Sibley & Sajovec

(57) ABSTRACT

Nonvolatile memory devices and methods of manufacturing nonvolatile memory devices are provided. The method includes patterning a bulk substrate to form an active pillar; forming a charge storage layer on a side surface of active pillar; and forming a plurality of gates connected to the active pillar, the charge storage layer being disposed between the active pillar and the gates. Before depositing a gate, a bulk substrate is etched using a dry etching to form a vertical active pillar which is in a single body with a semiconductor substrate.

3 Claims, 23 Drawing Sheets

US 8,053,829 B2

METHODS OF FABRICATING NONVOLATILE MEMORY DEVICES

CLAIM OF PRIORITY

This application claims priority to Korean Patent Application No. 2008-0125251, filed Dec. 10, 2008, the contents of which are hereby incorporated herein by reference as if set forth in its entirety.

FIELD

The present invention relates generally to semiconductor memory devices and methods of manufacturing the same, and more particularly, to nonvolatile memory devices and methods of manufacturing the same.

BACKGROUND

Increasing integration of a semiconductor memory device may allow superior performance and a lower price. Since an integration of a semiconductor memory device is a main factor in determining a device price, high integration is beneficial. In a case of two-dimensional or flat semiconductor memory devices, integration is determined mainly by an area which a unit memory cell occupies, so the integration is greatly affected by a level of technique forming a fine pattern. However, since very expensive equipment is needed to obtain a miniature of a pattern, an integration of two-dimensional semiconductor memory device increases, but the increase is still limited.

United States Patent Application Publication No. 2007/0252201 to Kito et al. entitled Nonvolatile semiconductor memory device and manufacturing method thereof discusses a technique of forming memory cells in three dimensions. As discussed therein, a vertical semiconductor pillar is used as an active region and memory cells are three-dimensionally formed. Thus, an area of a semiconductor substrate can be efficiently used and as a result, integration can be greatly increased compared with a conventional two-dimensional semiconductor memory device. Also, since the technique is not based on a method of repeating a step of two dimensionally forming memory cells but the technique forms word lines using a patterning process for defining an active region, a cost per bit can be greatly reduced.

SUMMARY

Some embodiments of the present invention provide methods of manufacturing nonvolatile memory devices including patterning a bulk substrate to form an active pillar; forming a charge storage layer on a side surface of active pillar; and forming a plurality of gates connected to the active pillar, the charge storage layer being disposed between the active pillar and the gates.

In further embodiments of the present invention, forming the active pillar may include etching the bulk substrate to form a semiconductor substrate; and forming the semiconductor substrate in concurrence with vertically forming the active pillar on the semiconductor substrate. Forming the charge storage layer may include forming an ONO layer covering the semiconductor substrate and the active pillar; and etching the ONO layer to leave the ONO layer on a side surface of active pillar.

In still further embodiments of the present invention, forming the plurality of gates may include vertically and alternatively depositing a plurality of sacrificial layers and the plurality of gates on the semiconductor substrate; and selectively removing the plurality of sacrificial layers.

In some embodiments of the present invention, vertically and alternatively depositing a plurality of sacrificial layers and the plurality of gates may include forming the plurality of sacrificial layers to have a plate shape by epitaxially growing silicon/germanium or silicon/carbon on the semiconductor substrate; and forming the plurality of conductive layers to have a plate shape by epitaxially growing silicon between the plurality of sacrificial layers.

In further embodiments of the present invention, selectively removing the plurality of sacrificial layers may include etching the plurality of sacrificial layers and the plurality of conductive layers to form a trench exposing the semiconductor substrate; and providing an etchant through the trench to etch the plurality of sacrificial layers.

In still further embodiments of the present invention, the method may further include etching the plurality of sacrificial layers to form a gate interlayer region exposing an ONO layer remaining on a side surface of active pillar; and etching the ONO layer exposed through the gate interlayer region to form a charge storage layer being limited between the active pillar and the plurality of gates and being divided according to the plurality of gates.

Some embodiments of the present invention provide nonvolatile memory devices including a substrate comprising a single crystalline semiconductor; an active pillar formed by patterning the substrate, the active pillar comprising the single crystalline semiconductor; a plurality of gates vertically deposited on the substrate and using the active pillar as a channel; and a charge storage layer disposed on a side surface of active pillar.

In further embodiments of the present invention, the plurality of gates may include any one of a line shape that is parallel to the substrate and crosses a side surface of active pillar and a plate shape that are parallel to the substrate and the active pillar vertically penetrates.

In still further embodiments of the present invention, the charge storage layer may include any one of an undivided shape that the charge storage layer is not divided according to the plurality of gates and a divided shape that the charge storage layer is divided according to the plurality of gates.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Figure 1A:
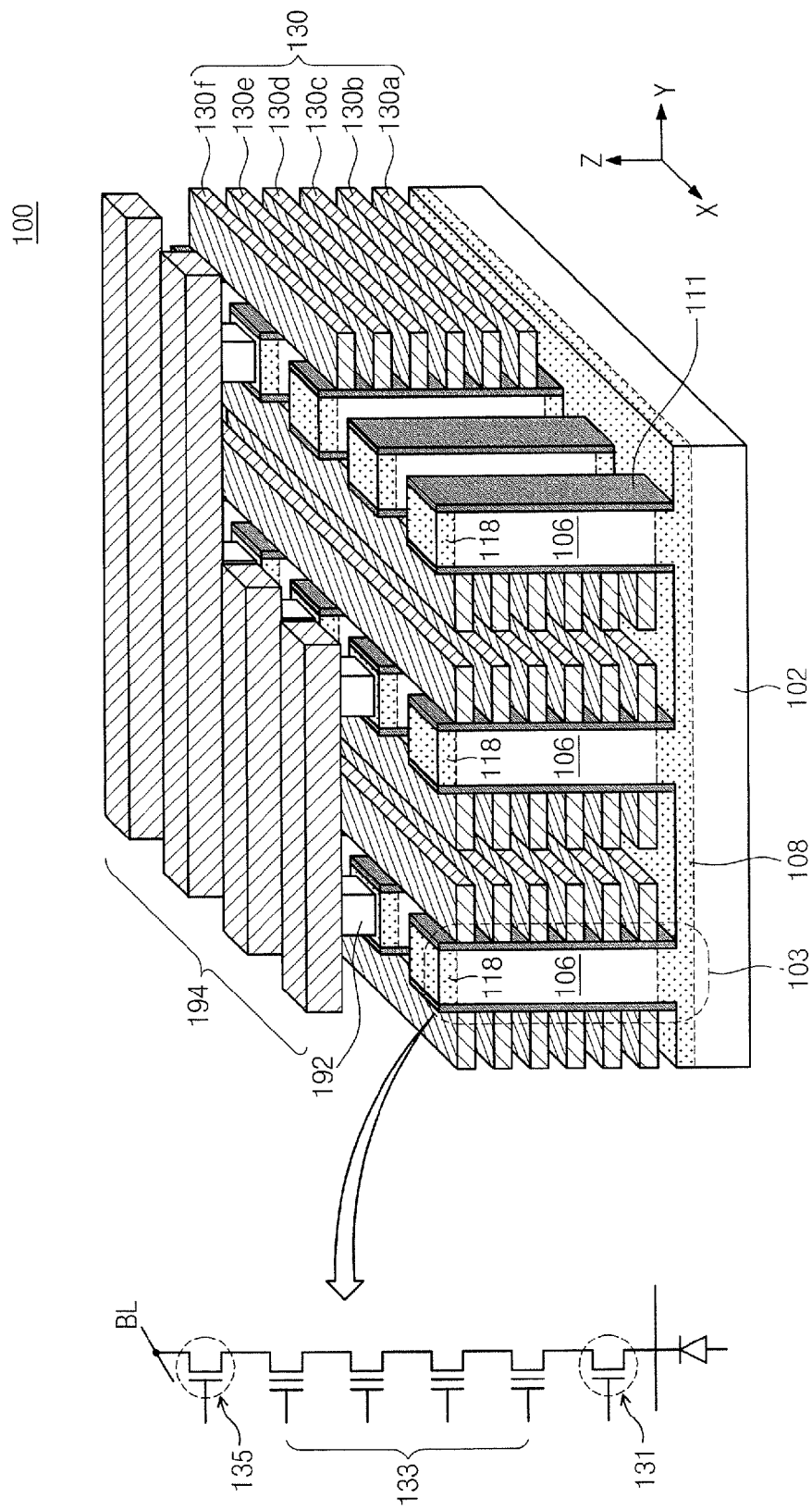
FIG. 1A is a perspective view of a nonvolatile memory device in accordance with some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1A is a perspective view of a nonvolatile memory device in accordance with some embodiment of the present invention. Referring to FIG. 1A, a nonvolatile memory device 100 may be a vertical NAND flash memory device including a cell region including an active pillar 106 vertically extending from a semiconductor substrate 102, a conductive layer group 130 used as a gate using the active pillar 106 as a channel and a plurality of conductive layers 194 which can be used as a bit line electrically connected to the active pillar 106.

The semiconductor substrate 102 may be formed in concurrence with the active pillar 106 by patterning a bulk substrate comprised of single crystalline silicon. A first junction region 108 (hereinafter it is referred to as a source) may be further included between the semiconductor substrate 102 and the active pillar 106. The source 108 may occupy a lower portion of active pillar 106. The semiconductor substrate 102 and the source 108 may be doped with different conductivity type from each other. For example, the semiconductor substrate 102 may be p-type that 3B group element such as boron (B) is doped in single crystalline silicon and the source 108 may be n-type that 5B group element such as phosphorous (P) is doped in single crystalline silicon.

The active pillar 106 vertically extends in a Z-direction and may be two-dimensionally disposed to be the plural number in an X-direction and a Y-direction. The active pillar 106 may be comprised of the same material and conductivity type, for example, a single crystalline silicon of p-type as the semiconductor substrate 102. That is, the semiconductor substrate 102 and the active pillar 106 may be formed in a single body. If the active pillar 106 is a single crystalline structure, it has no grain boundary, so a leakage current can be reduced and a current driving power can be improved. Furthermore, if the active pillar 106 is a single crystalline structure, since grain boundaries which can trap impurities do not exist in the active pillar 106 when an ion implantation process for forming source 108 and drain 118 is performed, an impurity concentration profile of the source 108 and the drain 118 can be set in a form with the desired properties.

An insulating layer 111 may be disposed on both sides of active pillar 106. According to the present embodiment, the insulating layer 111 may have a shape that is not divided according to a plurality of gates 130a through 130f, for example, a plate shape. The insulating layer 111 may include an insulator which can trap charges. For example, the insulating layer 111 may be comprised of an ONO layer that a silicon nitride is interposed between the silicon oxide layers. An upper portion of active pillar 106 may be occupied by a second junction region 118 (hereinafter it is referred to as a drain). The drain 118 may be doped with the same conductivity type as the source, for example, p-type.

The conductive layer group 130 may have a plate shape parallel to the substrate 102 and may be disposed to have a line shape that crosses the both sides of active pillar 106 and extends in the X-direction. The conductive layer group 130 may include a plurality of conductive layers 130a through 130f that are stacked vertically. Among the plurality of conductive layers 130a through 130f, the lowermost conductive layer 130a may be used as a lower select gate and the uppermost conductive layer may be used as an upper select gate. A plurality of medium conductive layers 130b through 130e may be used as control gates. In these embodiments, the conductive layer group 130 may be used together with the term "gate group", the lowermost conductive layer 130a may be used together with the term "lower select gate", the uppermost conductive layer 130f may be used together with the term "upper select gate" and the medium conductive layers 130b through 130e may be used together with the term "control gate".

The nonvolatile memory device 100 may further include a peripheral region including a peripheral circuit operating a cell region identically or similarly to the manner disclosed in the U.S. Patent Application Publication No. 2007/0252201, the disclosure of which is hereby incorporated herein as if set forth in its entirety. For example, the nonvolatile memory device 100 may further include an upper select line driving circuit electrically connected to the upper select gate 130f, a word line driving circuit electrically connected to the plurality of control gates 130b through 130e, a lower select line driving circuit electrically connected to the lower select gate 130a and a common source line electrically connected to the source 108 identically or similarly to the manner disclosed in the U.S. Patent Application Publication No. 2007/0252201.

The insulating layer 111 disposed between the control gates 130b through 130e and the active pillar 106 may be used as a charge storage layer which traps charges to store data. If the insulating layer 111 is comprised of an ONO layer, a silicon nitride layer may actually trap charges to store data and any one of two silicon oxide layers may be used as a tunnel insulating layer and the other may be used as a blocking insulating layer. According to some embodiments of the present invention, the insulating layer 111 may be used together with the term "a charge storage layer". The charge storage layer 111 disposed between the lower select gate 130a and the active pillar 106 and between the upper select gate 130f and the active pillar 106 may be used as a gate insulating layer.

The conductive group 130 may be comprised of a conductor, for example, silicon, metal or combinations thereof so that the conductive group 130 is used as a gate. According to some embodiments, the conductive group 130 may be comprised of single crystalline silicon doped with impurities. The plurality of conductive layers 130a through 130f may have the same widths. Since a width of each of conductive layers 130a through 130f can determine a channel length, the width can be voluntarily selected within the range that can solve an electrical characteristic problem in accordance with a single channel. According to some embodiments, as will be discussed later, since the conductive layer group 130 can be formed using an epitaxial technique, a channel length of the conductive layer can be precisely controlled.

A plurality of conductive layers 194 (hereinafter it is referred to as a bit line) can be electrically connected to the active pillar 106 by the medium of a plug 192. The bit line 194 may extend in a direction, for example, the Y-direction, perpendicular to the extension direction, for example, the X-direction, of the conductive layer group 130. The bit line 194 may be comprised of silicon or metal, for example, aluminum, copper. For another example, as depicted in FIG. 2O, the plurality of conductive layers 94 may be directly and electrically connected to the active pillar 106.

The active pillar 106 and the lower select gate 130a define a lower select transistor 131, the active pillar 106 and the plurality of control gates 130b through 130e define memory transistors 133, and the active pillar 106 and the upper select gate 130f define an upper select transistor 135. The nonvolatile memory device 100 may be a vertical NAND flash memory device that the upper select transistor 135, the plurality of memory transistors 133 and the lower select transistor 131 are vertically and serially connected to each other at both sides of active pillar 106 to constitute a cell string 103. The cell string 103 of the present embodiment has four memory transistors 133. The number of the memory transistors 133 is not limited to four but may be changed to the voluntary number depending on a memory capacity.

Each of the active pillars 106 may penetrate the vertically-stacked control gates 130b through 130e in the Z-direction. Thus, intersection points between the active pillars 106 and the control gates 130b through 130e may be three-dimensionally distributed. The memory transistors 133 of the nonvolatile memory device 100 are respectively formed at the intersection points that are three-dimensionally distributed to constitute a three-dimensional arrangement.

Figure 1B:
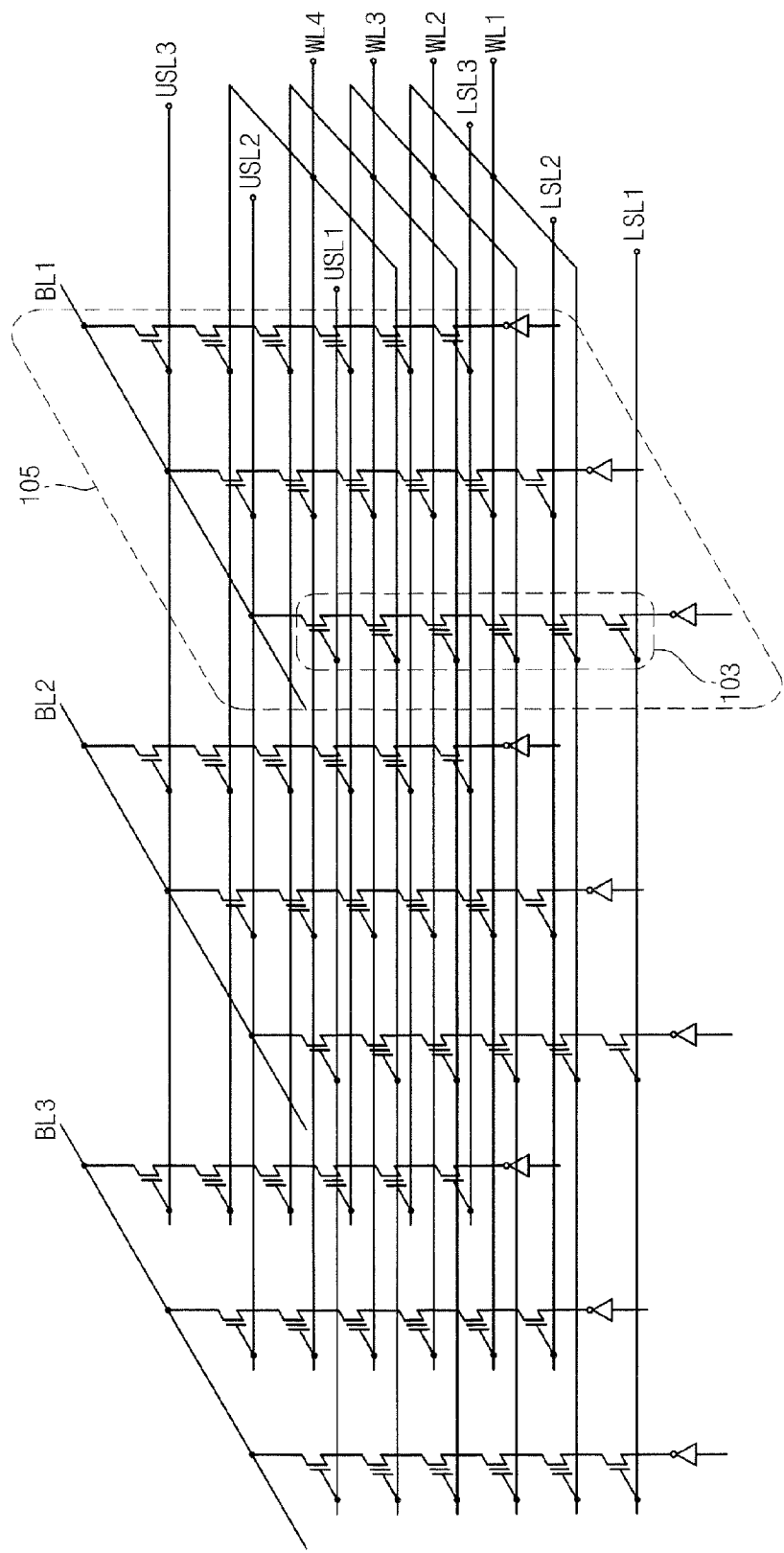
FIG. 1B is an equivalent circuit of a nonvolatile memory device in accordance with some embodiments of the present invention.

FIG. 1B is an equivalent circuit of a nonvolatile memory device in accordance with some embodiments of the present invention. Descriptions which will be described below can be applied to not only the nonvolatile memory device 100 but also nonvolatile memory devices 200, 300 and 400 discussed below with reference to FIGS. 1C through 1E.

Referring to FIGS. 1A and 1B, in the nonvolatile memory device 100, the plurality of control gates 130b through 130e can be used as a plurality of word lines (WL1-WL4), a plurality of upper select gates 130f can be used as a plurality of upper select lines (USL1-USL3), a plurality of the lower select gates 130a can be used as a plurality of lower select lines (LSL1-LSL3) and a plurality of conductive layer 194 can be used as a plurality of bit lines (BL1-BL3). A plurality of cell strings 103 may be connected to each of the bit lines (BL1-BL3) to define a block 105. In the nonvolatile memory device 100, an erasing operation may be performed by the block 105 unit.

Each of the word lines (WL1-WL4) may have a two-dimensional flat structure and may be substantially perpendicular to the cell string 103. Each of the plurality of lower select lines (LSL1-LSL3) is serially connected to each of the plurality of upper select lines (USL1-USL3) and each of the plurality of upper select lines (USL1-USL3) may be electrically connected to each of the plurality of bit lines (BL1-BL3). Accordingly, one cell string 103 may be independently selected.

In the nonvolatile memory device 100, a program operation may be performed by setting a voltage difference between selected word line (WL) and the active pillar 106 to move charges into the charge storage layer 111. For example, a program operation may be performed by applying a program voltage (Vprog) to the selected word line (WL) to move electrons into the charge storage layer 111 of the memory transistor 133 which belongs to the word line (WL) that is to be programmed from the active pillar 106 using Fowler-Nordheim tunneling phenomenon. Since a program voltage applied to the selected word line (WL) may program a memory transistor which belongs to unselected word line, unwanted program may be prevented using a boosting technique.

A reading operation may be performed as follows. 0 volt is set in a word line to which a memory transistor 133 that is to be read is connected and a reading voltage (Vread) is set in other word lines. As a result, whether a bit line (BL) is charged with a current or not depends on whether a threshold voltage of a memory transistor to be read is greater or smaller than 0 volt. Accordingly, data of a memory transistor that is to be read can be read by detecting a current of a bit line (BL).

An erasing operation may be performed by a block 105 unit using "gate induced drain leakage current (GIDL)". For example, an electric potential of the active pillar 106 is increased by applying an erasing voltage to a selected bit line (BL) and the semiconductor substrate 102. At this time, an electric potential of the active pillar 106 may be increased with some delay. Accompanying with the increase of electric potential, GIDL occurs in a terminal of the lower select gate 130a, electrons generated by GIDL are discharged to the semiconductor substrate 102 and holes generated by GIDL are discharged to the active pillar 106. As a result, an electric potential around the erasing voltage (Verase) can be transferred to a channel of a memory transistor 133 (i.e., the active pillar 106). At this time, if an electric potential of a word line (WL) is set by 0 volt, electrons accumulated in the memory transistor 133 are discharged, so data erasing operation can be embodied. A word line of unselected block may be floated so that unwanted erasing operation is not performed.

An operation method of the nonvolatile memory device 100 in accordance with embodiments of the present invention is illustrative of a technical sprit of the present invention and is not to be construed as limiting thereof. It is readily apparent to those of skilled in the art that various modifications may be made based on published arts. For example, an operation of the nonvolatile memory device 100 can be embodied using the method disclosed in the U.S. Patent Application Publication No. 2007/0252201 used as a reference document of the present specification.

Figure 1C:
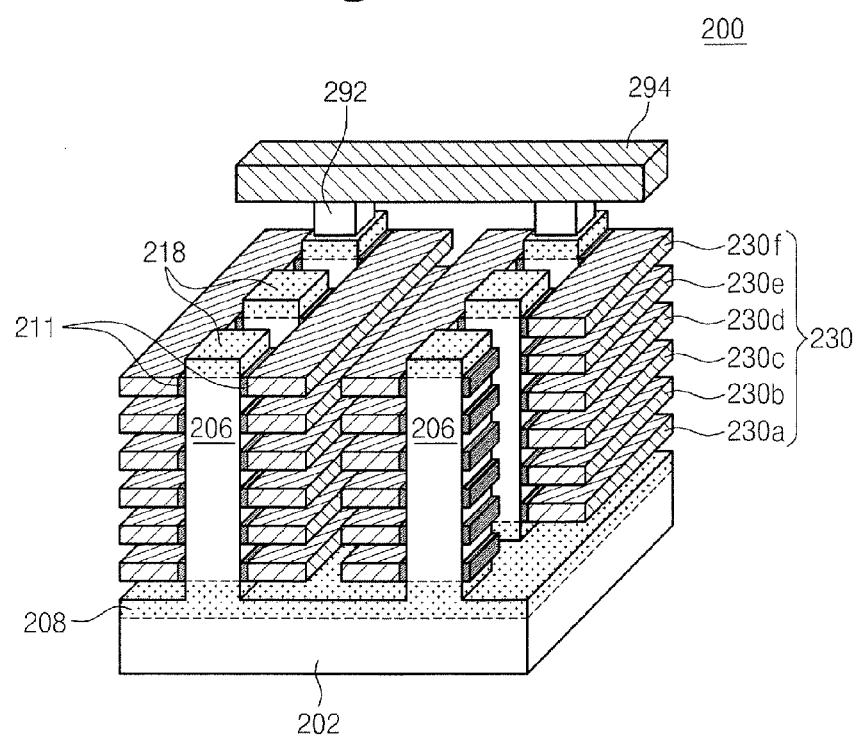
FIG. 1C is a perspective view of a nonvolatile memory device in accordance with some embodiments of the present invention.

FIG. 1C is a perspective view of a nonvolatile memory device in accordance with some embodiments of the present invention. The nonvolatile memory device of FIG. 1C is similar to the nonvolatile memory device described with respect to FIGS. 1A and 1B. Therefore, the descriptions of common features are omitted, while any new or different features are described in further detail below.

Referring to FIG. 1C, a nonvolatile memory device 200 may be a vertical NAND flash memory device including an active pillar 206 vertically extending from a semiconductor substrate 202, a gate group 230 using the active pillar 206 as a channel and a bit line 294 electrically connected to the active pillar 206.

The semiconductor substrate 202 and the active pillar 206 may be comprised of, for example, p-type single crystalline silicon. An n-type drain 218 and an n-type source 208 may be formed on a top portion and a bottom portion of active pillar 206, respectively. The gate group 230 may include a lower select gate 230a, an upper select gate 230f and a plurality of control gates 230b through 230e. The gate group 230 may be formed to have a line shape on both sides of active pillar 206. The bit line 294 may be electrically connected to the active pillar 206 by the medium of a plug 292. For another example, as depicted in FIG. 3F, the bit line 294 may be directly connected to the active pillar 206.

A charge storage layer 211 may be disposed on both sides of active pillar 206 to be limited between the active pillar 206 and the gate group 230. That is, the charge storage layer 211 is limited between the active pillar 206 and each of the plurality of gates 230a through 230f to have a divided shape that is divided according to each of the gates 230a through 230f. Thus, there is very little probability that charges trapped in the charge storage layer 211 move to other gates, so an error in an operation may be reduced.

Figure 1D:
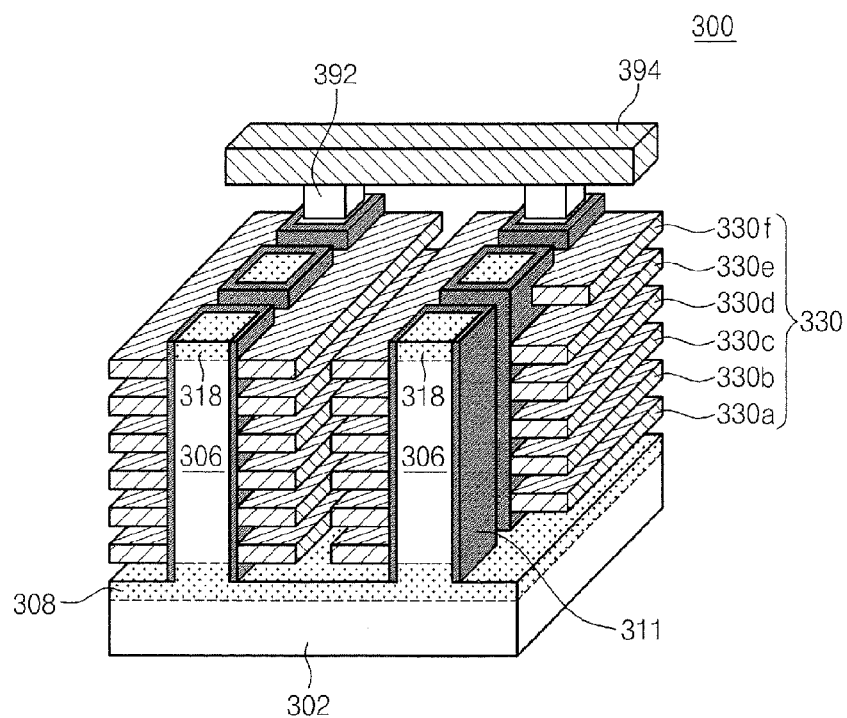
FIG. 1D is a perspective view of a nonvolatile memory device in accordance with some embodiments of the present invention.

FIG. 1D is a perspective view of a nonvolatile memory device in accordance with some embodiments of the present invention. The nonvolatile memory device of still another FIG. 1D is similar to the nonvolatile memory device discussed above with respect to FIGS. 1A and 1B. Therefore, the descriptions of common features are omitted, while any new or different features are described in further detail below.

Referring to FIG. 1D, a nonvolatile memory device 300 may be a vertical NAND flash memory device including an active pillar 306 vertically extending from a semiconductor substrate 302, a gate group 330 using the active pillar 306 as a channel and a bit line 394 electrically connected to the active pillar 306.

The gate group 330 may include a lower select gate 330a, an upper select gate 330f and a plurality of control gates 330b through 330e. A drain 318 and a source 308 may be disposed on a top portion and a bottom portion of active pillar 306, respectively. The bit line 394 may be electrically connected to the active pillar 306 by the medium of a plug 392 or may be directly connected to the active pillar 306.

As an alternative to the nonvolatile memory device 100 of FIG. 1A, a charge storage layer 311 may have a shape surrounding the active pillar 306, the gate group 330 may have a horizontal plate shape and the active pillar 306 may vertically penetrate the gate group 330. Thus, a contact area between the active pillar 306 and each of the gates 330a through 330f may be enlarged.

Figure 1E:
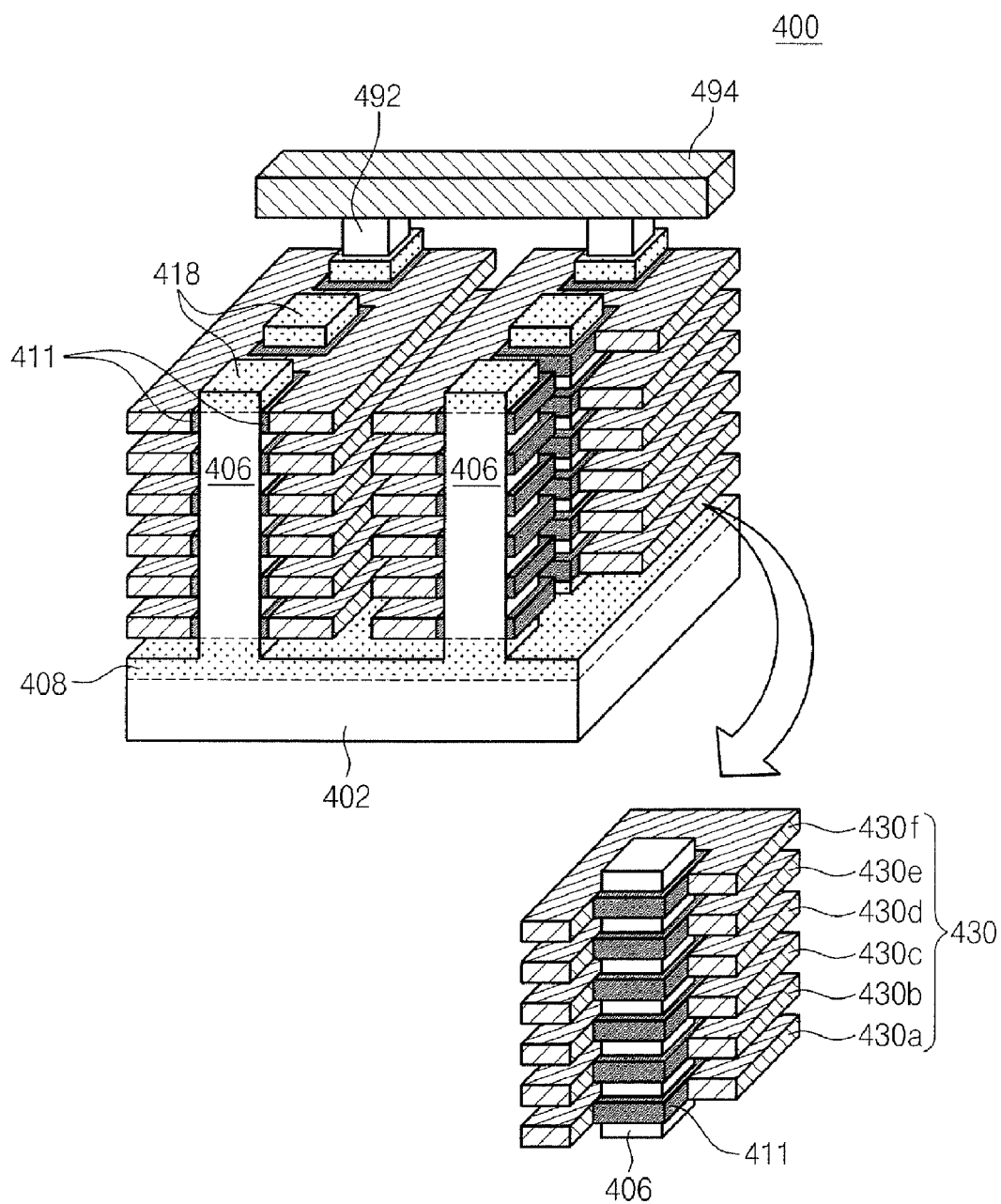
FIG. 1E is a perspective view of a nonvolatile memory device in accordance with some embodiments of the present invention.

FIG. 1E is a perspective view of a nonvolatile memory device in accordance with some embodiment of the present invention. The nonvolatile memory device of FIG. 1E is similar to the nonvolatile memory device described with respect to FIG. 1D. Therefore, the descriptions of common features are omitted, while any new or different features are described in further detail below.

Referring to FIG. 1E, a nonvolatile memory device 400 may be a vertical NAND flash memory device including an active pillar 406 vertically extending from a semiconductor substrate 402, a gate group 430 using the active pillar 406 as a channel and a bit line 494 electrically connected to the active pillar 406.

The gate group 430 may include a lower select gate 430a, an upper select gate 430f and a plurality of control gates 430b through 430e and may have a horizontal plat shape. The active pillar 406 may vertically penetrate the gate group 430. A drain 418 and a source 408 may be disposed on a top portion and a bottom portion of active pillar 406, respectively. The bit line 494 may be electrically connected to the active pillar 406 by the medium of a plug 492 or may be directly connected to the active pillar 406.

As an alternative to the nonvolatile memory device 300 of FIG. 1D, a charge storage layer 411 may have a ring or band shape surrounding a side of active pillar 406. Thus, the charge storage 411 is limited between the active pillar 406 and the gate group 430 to have a separated shape divided according to each of the gates 430a through 430f.

Figure 2A:
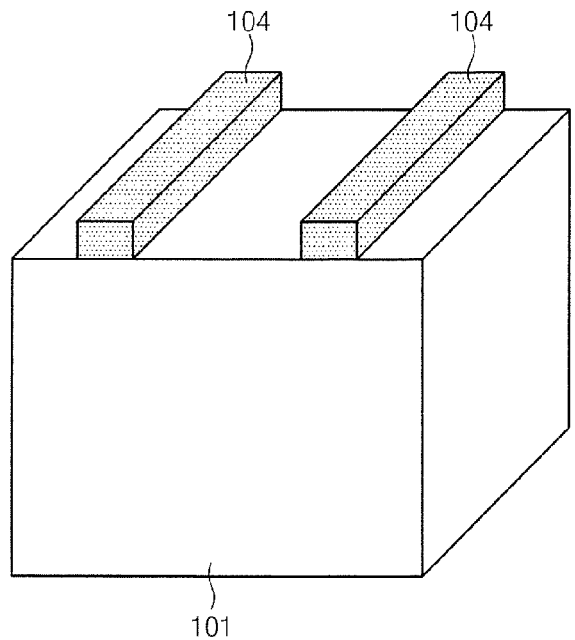
FIGS. 2A through 2O are perspective views illustrating processing steps in the fabrication of nonvolatile memory devices in accordance with some embodiments of the present invention.

FIGS. 2A through 2O are perspective views illustrating processing steps in the fabrication of a nonvolatile memory device in accordance with some embodiments of the present invention. Referring to FIG. 2A, a hard mask 104 is formed on a bulk substrate 101. The bulk substrate 101 may be doped with a first conductivity type and comprised of a semiconductor. For example, the bulk substrate 101 may be p-type single crystalline substrate doped with 3B group element such as boron (B), gallium (Ga) and indium (In). The hard mask 104 may be formed to have a line shape by forming an insulating material such as a silicon nitride layer using a deposition process, and then etching the deposited insulating material.

Figure 2B:
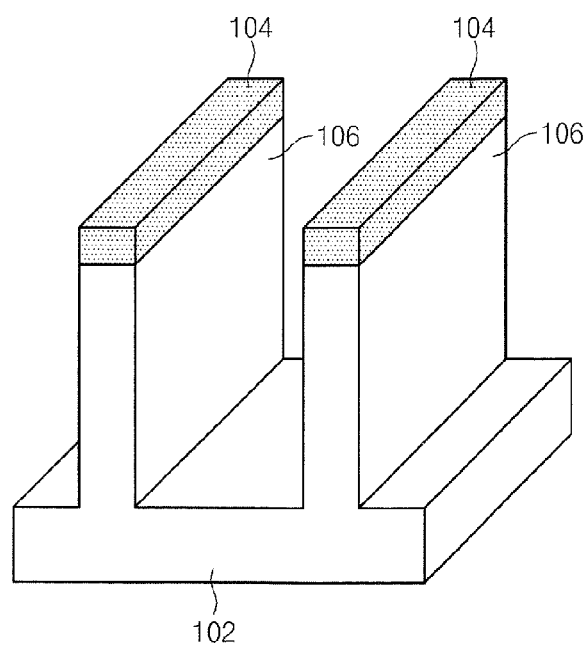

Referring to FIG. 2B, the bulk substrate 101 is selectively removed by an etching process using the hard mask 104 as a mask. As a result, the bulk substrate 101 may be formed of a semiconductor substrate 102 and a plurality of active pillars 106. As will be described later, the active pillar 106 may be used as a channel of a plurality of transistors. The active pillar 106 may be formed to have a vertical shape so that a cross section of the active pillar 106 is not changed depending on a height of the active pillar 106 so as to embody a uniform electrical characteristic of the plurality of transistors. For this, an etching process for forming the active pillar 106 may be a dry etching capable of embodying an anisotropical etching. Since the hard mask 104 has a line shape, the active pillar 106 may be formed to have a line shape. The active pillar 106 may be comprised of, for example, p-type single crystalline silicon which is the same material as the semiconductor substrate 102.

As disclosed in the U.S. Patent Application Publication No. 2007/0252201, titled "Nonvolatile semiconductor memory device and manufacturing method thereof", the active pillar 106 is formed by after stacking conductive layers and insulating layers several times, forming an opening penetrating the conductive layers and insulating layers to expose a substrate, and then filling the opening with silicon. In this case, an etch profile may become ununiform and embodying a 90 degrees etch slope may become difficult. What is worse, even when an opening is formed, a substrate may not be exposed. In addition, since the active pillar is formed by filling the opening with silicon, a void may exist in the active pillar and a chemical mechanical polishing process may further be required. According to some embodiments, a dry etching is performed on the bulk substrate 101 in the beginning of a process to form the active pillar 106. Accordingly, since an etching process for formation of an opening and a silicon filling process may be avoided, the problems of conventional process such as ununiformity of an etch profile, difficulty of embodiment of 90 degrees etch slope, a void occurrence, addition of a process or the like may be avoided.

Figure 2C:
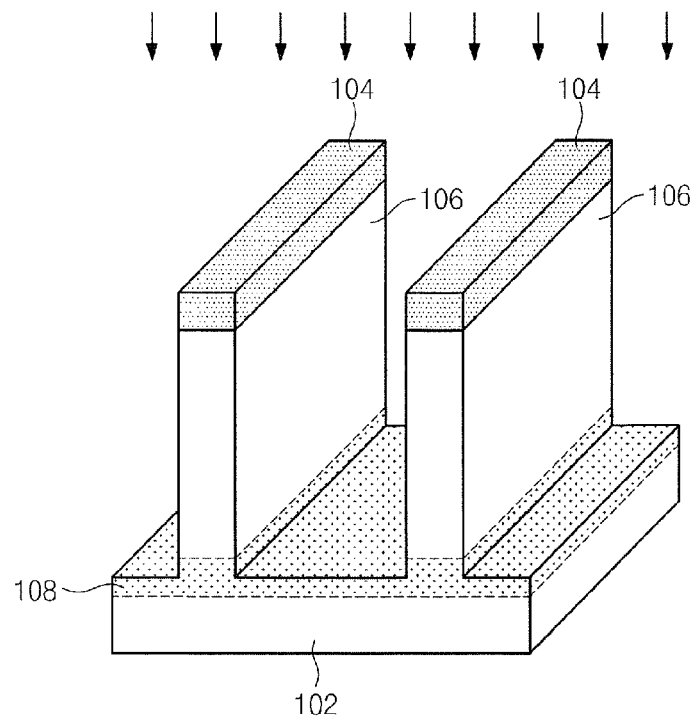

Referring to FIG. 2C, a first junction region 108 may be selectively formed. For one example, a 5B group element such as phosphorus (P), arsenic (As), antimony (Sb) or the like or an impurity including a 5B group element is provided to the semiconductor substrate 102 to form the first junction region 108 (hereinafter it is referred to as source) of a second conductivity type (i.e., n-type). An annealing process may be further added so as to accelerate a diffusion of an impurity doped in the semiconductor substrate 102. The source 108 is formed in the semiconductor substrate 102 and may occupy a bottom portion of active pillar 106.

Figure 2D:
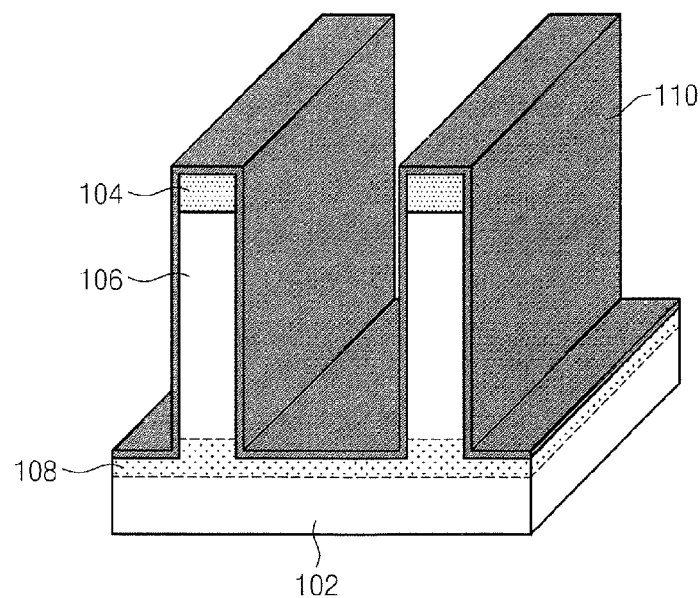

Referring to FIG. 2D, an insulating layer 110 is formed. For one example, the insulating layer 110 covering the semiconductor substrate 102 and the active pillar 106 may be conformally formed using a deposition process. A chemical vapor deposition (CVD) process or an atomic layer deposition (ALD) process may be selected as a deposition process for forming the insulating layer 110. The insulating layer 110 may be formed of an oxide layer-a nitride layer-an oxide layer, for example, an ONO layer that a silicon nitride layer or a silicon oxynitride layer is inserted between silicon oxide layers.

Figure 2E:
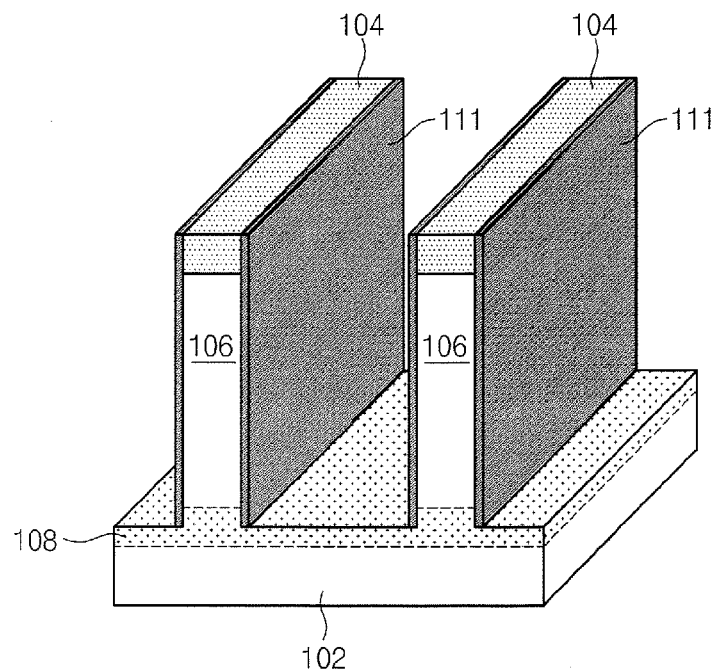

Referring to FIG. 2E, a portion of insulating layer 110 is removed using an etching process so that an insulating material 111 (hereinafter it is referred to as a charge storage layer) remains on side surfaces of active pillar 106 and the hard mask 104. For example, a dry etching process is performed on the insulating layer 110 to remove the insulating formed on a top surface of the semiconductor substrate 102 and a top surface of the hard mask 104. As a result, the charge storage layer 111 may remain on the side surfaces of active pillar 106 and the hard mask 104. The charge storage layer 111 may be formed to have a plate shape on the side surfaces of active pillar 106 and hard mask 104.

Figure 2F:
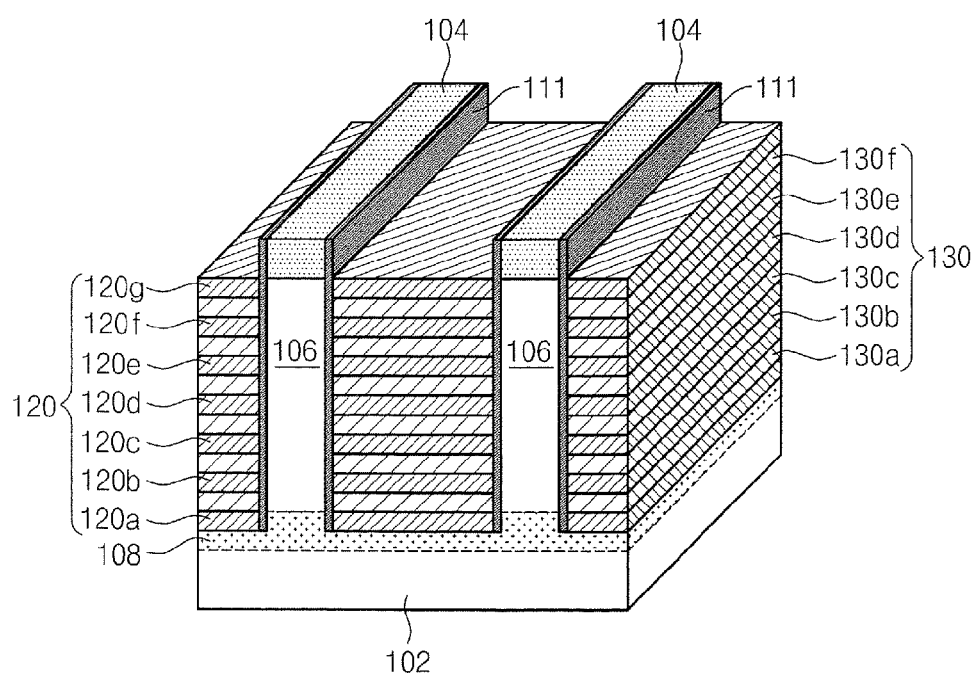

Referring to FIG. 2F, a sacrificial layer group 120 and a conductive layer group 130 are formed. The sacrificial layer group 120 and the conductive layer group 130 may be formed on the side surfaces of active pillar 106. The sacrificial layer group 120 may include a plurality of sacrificial layers 120a through 120g and the conductive layer group 130 may include a plurality of conductive layers 130a through 130f. The plurality of sacrificial layers 120a through 120g and the plurality of conductive layers 130a through 130f are alternatively disposed to form a sandwich shape. For example, a sacrificial layer 120a may be formed just on the semiconductor substrate 102, a conductive layer 130a may be formed just on the sacrificial layer 120a and a sacrificial layer 120g covering a conductive layer 130f may be formed on the uppermost layer.

The plurality of conductive layers 130a through 130f constituting the conductive layer group 130 may be used as a gate of a transistor. A conductive layer 130a of the lowermost layer among the conductive layer group 130 may be used as a lower select gate and a conductive layer 130f of the uppermost layer among the conductive layer group 130 may be used as an upper select gate. Conductive layers 130b through 130e between the conductive layers 130a and 130f may be used as control gates. The plurality of conductive layers 130a through 130f may be formed of a conductor such as silicon or metal and may be formed to have a plate shape so that the conductive layer group 130 may be used as a gate. The number of the conductive layers 130b through 130e that is to be used as a control gate is four but the number is arbitrary.

For one example, a single crystalline silicon may be grown using an epitaxial technique to form the plurality of conductive layers 130a through 130f having a plate shape. For example, the conductive layer group 130 having a plate shape comprised of a plurality of single crystalline layers may be formed by providing a source gas (e.g., $SiH_4$) and selecting an epitaxial growth method. For another example, the plurality of conductive layers 130a through 130f having a plate shape may be formed by providing silicon source gas together with an impurity source gas to epitaxially grow a single crystalline silicon doped with an impurity. The impurity may include 3B group element or 5B group element. For example, the conductive layer group 130 comprised of a plurality of single crystalline layers doped with an impurity having a plate shape may be formed by providing a source gas (e.g., $SiH_4$) and an impurity source gas (e.g., $PH_3$ or $BF_3$), and selecting an epitaxial growth method.

The plurality of sacrificial layers 120a through 120g constituting the sacrificial layer group 120 may be removed by an etching process as will be described later. The plurality of sacrificial layers 120a through 120g may be formed of material having an etching selectivity with respect to the plurality of conductive layers 130a through 130f and having a plate shape so that a removal of the conductive layer group 130 is minimized during removal of the plurality of sacrificial layers 120a through 120g. A sacrificial layer 120a of the lowermost layer may be formed just on the semiconductor substrate 102 and other sacrificial layers 120b through 120g except the sacrificial layer 120a may be formed on the conductive layers 130a through 130f. Thus, when the semiconductor substrate 102 and the conductive layers 130a through 130f are formed of silicon, the plurality of sacrificial layers 120a through 120g may be formed of material including silicon using an epitaxial technique so that the plurality of sacrificial layers 120a through 120g has an etching selectivity with respect to silicon and has a plate shape. A material including silicon for forming the plurality of sacrificial layers 120a through 120g may be a material including silicon and 4B group element, for example, silicon/germanium or silicon/carbon. For example, the sacrificial layer group 120 having a plate shape comprised of a plurality of silicon/germanium layers may be formed by providing a source gas (e.g., $SiH_4$) and a germanium source gas ($GeH_4$) and selecting an epitaxial growth method.

As described above, the plurality of sacrificial layers 120a through 120g and the plurality of conductive layers 130a through 130f are alternatively disposed to form a sandwich shape. For example, a formation process of a sacrificial layer providing a silicon source gas (e.g., SiH4) and a germanium source gas (GeH4) and selecting an epitaxial growth method and a formation process of a conductive layer providing a silicon source gas (e.g., SiH4) and an impurity source gas (PH3 or BF3) and selecting an epitaxial growth method may be alternatively performed to form the sacrificial layer group 120 and the conductive layer group 130. Thicknesses of the plurality of sacrificial layers 120a through 120g may be set to a wanted value by controlling a time of a formation process of the sacrificial layers 120a through 120g. Similarly, thicknesses of the plurality of conductive layers 130a through 130f may be set to a wanted value by controlling a time of a formation process of the conductive layers 130a through 130f.

Figure 2G:
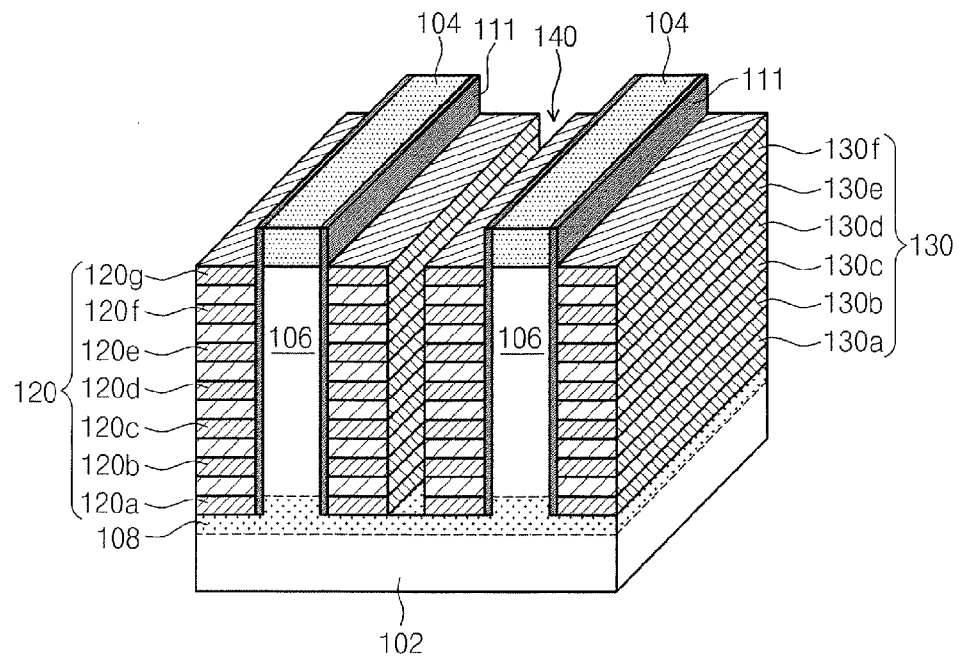

Referring to FIG. 2G, the sacrificial layer group 120 and the conductive layer group 130 are patterned to form a trench 140 exposing the semiconductor substrate 102. The trench 140 may be formed to have a line shape. The trench 140 may be formed between the adjacent active pillars 106 and may preferably be formed at the center between the adjacent active pillars 106. Thus, the sacrificial layer group 120 and the conductive layer group 130 between the adjacent active pillars 106 are divided into two groups respectively, so side surfaces of divided sacrificial layer group 120 and the conductive layer group 130 may be exposed. The trench 140 may be formed to have a vertical profile so that the sacrificial layer group 120 and the conductive layer group 130 are divided to have the same shape. Thus, the trench 140 may be formed using a dry etching to have a vertical profile.

Figure 2H:
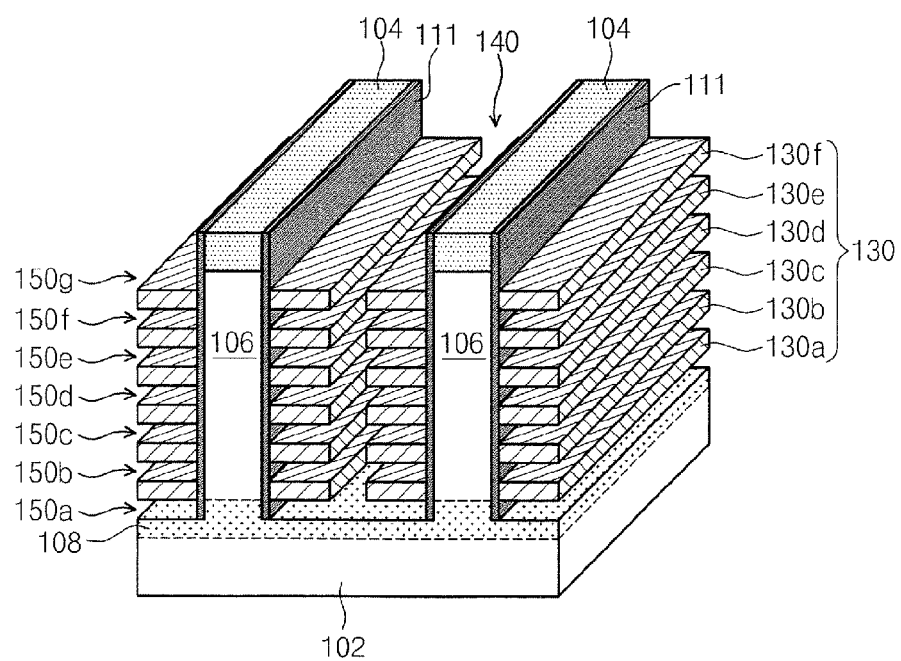

Referring to FIG. 2H, the sacrificial layer group (120 of FIG. 2G) divided and exposed by the trench 140 is removed. An etchant which will be described later is provided through the trench 140 to selectively remove the sacrificial layer group 120 exposed by the trench 140. A plurality of gate interlayer regions 150a through 150g exposing the charge storage layer 111 may be formed on and under the respective conductive layers 130a through 130f by the selective removal of the sacrificial layer group 120. At a side of active pillar 106, the plurality of conductive layers 130a through 130f may be separated from each other up and down and may have a line shape extending in a specific direction.

When the semiconductor substrate 102 and the conductive layer group 130 are formed of silicon and the sacrificial layer group 120 is formed of silicon/germanium, the sacrificial layer group 120 may be removed using an etching process selectively removing silicon/germanium with respect to silicon. For example, the sacrificial layer group 120 may be removed by a wet etching using a mixture including hydrogen peroxide ($H_2O_2$), hydrofluoric acid (HF) and acetic acid ($CH_5COOH$) or a mixture including ammonium hydroxide ($NH_4OH$), hydrogen peroxide ($H_2O_2$) and deionized water ($H_2O$) as an etchant. For another example, the sacrificial layer group 120 may be removed by a wet etching using a solution of which the main chemical is nitric acid ($HNO_3$) as an etchant. For anther example, the sacrificial layer group 120 may be removed by a wet etching using a mixture of nitric acid ($HNO_3$) including hydrofluoric acid (HF), acetic acid ($CH_5COOH$) and deionized water ($H_2O$).

Figure 2I:
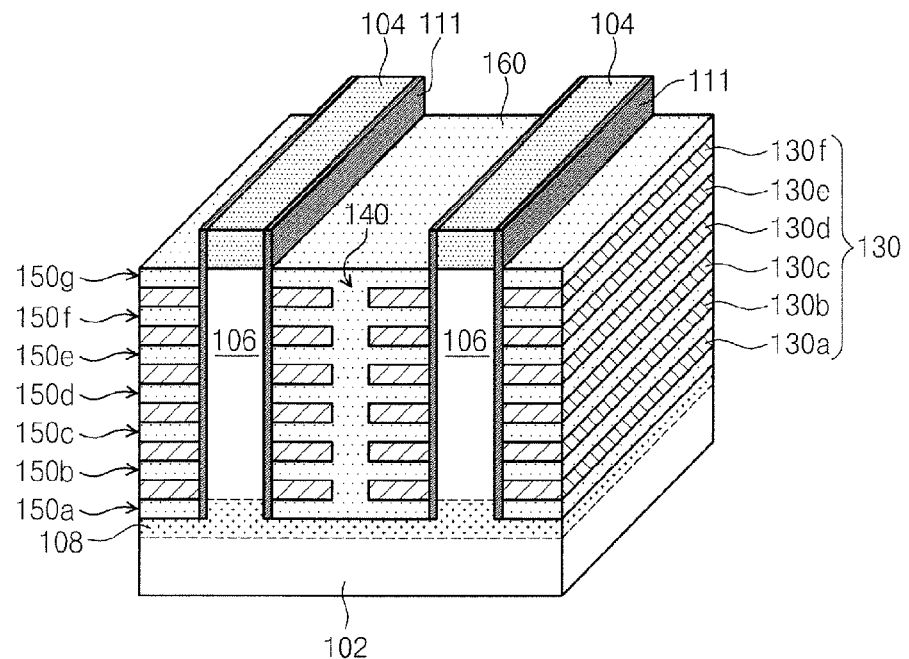

Referring to FIG. 2I, an insulating layer 160 filling the trench 140 and the gate interlayer region 150a through 150g is formed. The insulating layer 160 may be formed by depositing an insulator using a chemical vapor deposition (CVD) process. For example, the insulating layer 160 may be formed by depositing a silicon oxide layer ($SiO_2$), a silicon nitride layer (SiN or $Si_3N_4$) or a silicon oxynitride layer (SiON). Since the insulator 160 is deposited in the gate interlayer region 150a through 150g when forming the insulating layer 160, a spin-on-glass (SOG) method having a superior gap fill characteristic may be used.

Figure 2J:
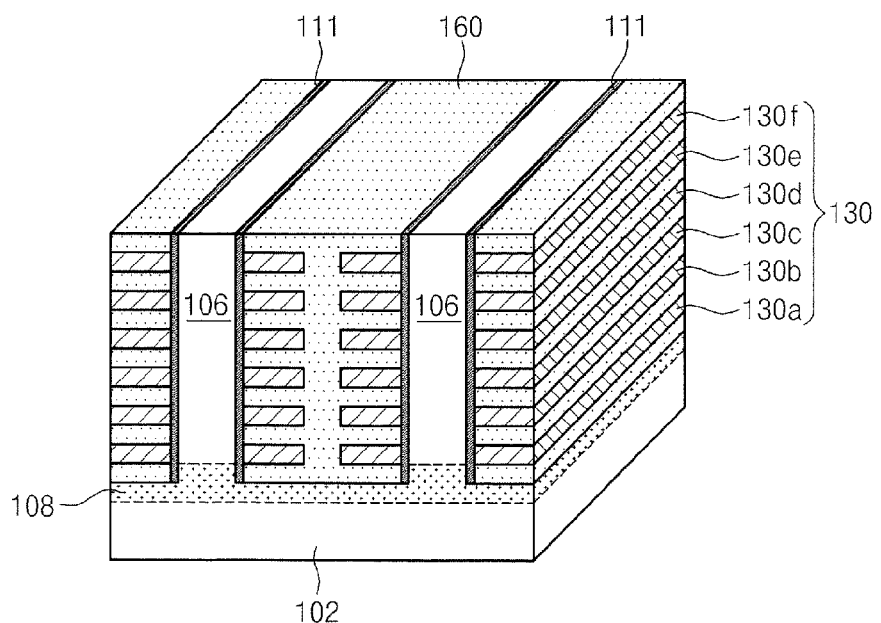

Referring to FIG. 2J, the hard mask (104 of FIG. 2I) is removed. The hard mask 104 may be removed using, for example, a chemical mechanical polishing (CMP). In this case, the charge storage layer 111 formed on a side surface of hard mask 104 may be removed together with the hard mask 104. A top surface of the active pillar 106 may be exposed by a removal of the hard mask 104.

Figure 2K:
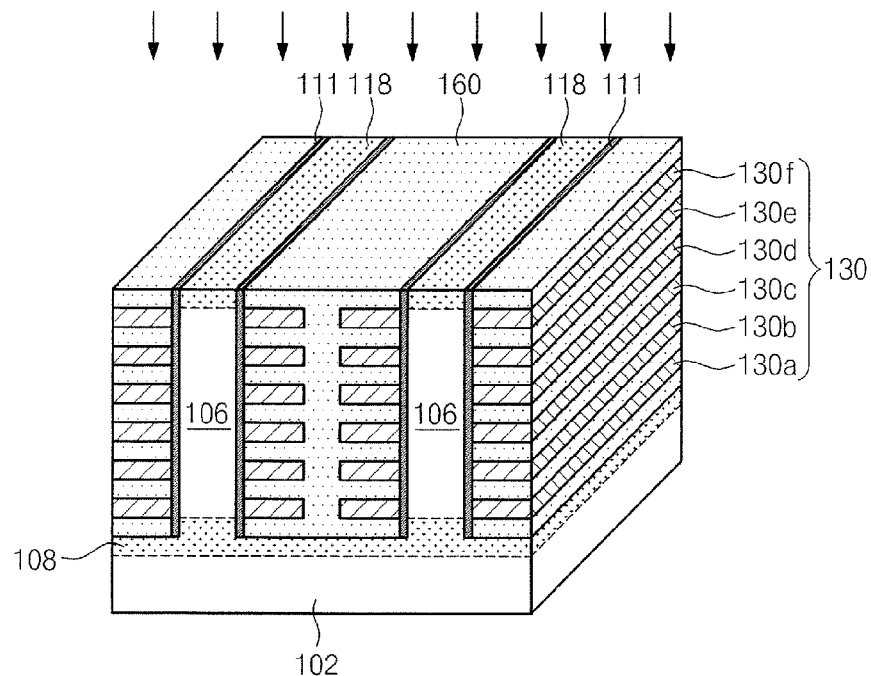

Referring to FIG. 2K, a second junction region 118 may be selectively formed. The second junction region 118 may be doped with the same conductivity type as the first junction region 108. For example, 5B group element such as phosphorous (P), arsenic (As), antimony (Sb) or an impurity including 5B group element are provided to the active pillar 106 to form a second junction region 118 (hereinafter it is referred to as drain) of n-type. An annealing process may be further added so as to accelerate a diffusion of an impurity doped in the active pillar 106. The drain 118 may occupy an upper portion of active pillar 106. For another example, the drain 118, as will be described in FIG. 2M, may be formed by providing an impurity to the active pillar 106 after forming an insulating layer 180 or by providing an impurity, and then performing an annealing process.

Figure 2L:
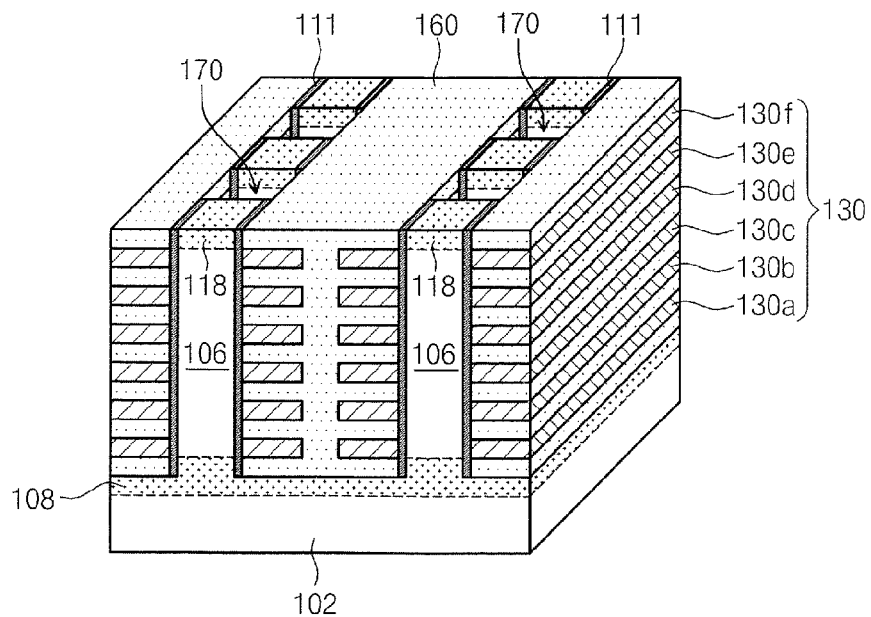

Referring to FIG. 2L, the active pillar 106 is patterned to form a plurality of isolation regions 170 penetrating a portion of active pillar 106. The isolation region 170 may be formed by removing a portion of active pillar 106 until the semiconductor substrate 102 is exposed using a dry etching process.

The active pillar 106 may be changed from a line shape to a dot shape by the isolation region 170.

Figure 2M:
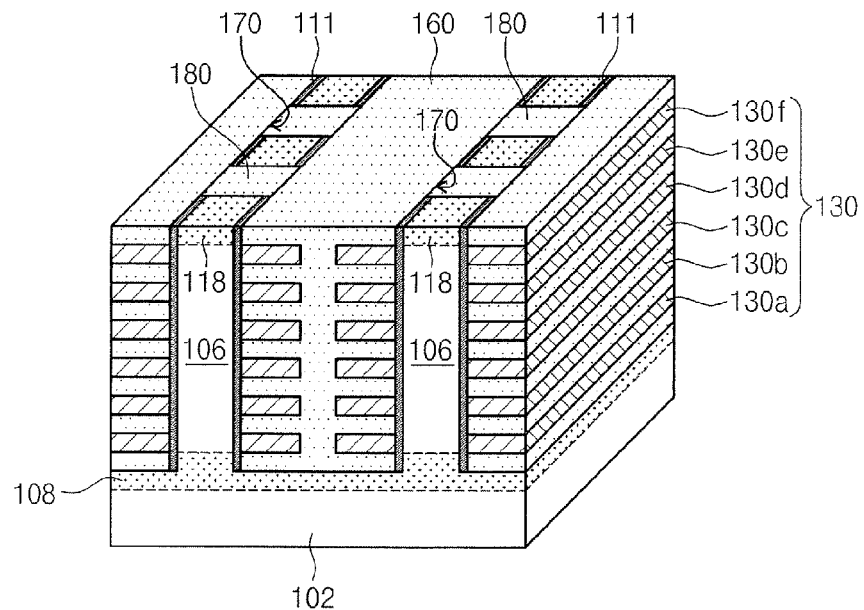

Referring to FIG. 2M, the isolation region 170 is filled with an insulator to form an insulating layer 180. The insulating layer 180 may be formed of material similar to the insulating layer 160. For example, the insulating layer 180 may be formed by depositing a silicon oxide layer (SiO2), a silicon nitride layer (SiN or Si3N4) or a silicon oxynitride layer (SiON) using a deposition process. The deposition process may use a physical vapor deposition (PVD) or a chemical vapor deposition (CVD). When forming the insulating layer 180, the insulator may be deposited to cover the insulating layer 160. In this case, a chemical mechanical polishing (CMP) process or an etch back process may be further performed until the insulating layer 160 and/or the active pillar 106 are exposed. After forming the insulating layer 180, the drain 118 may be formed as already described by making reference to FIG. 2K.

Figure 2N:
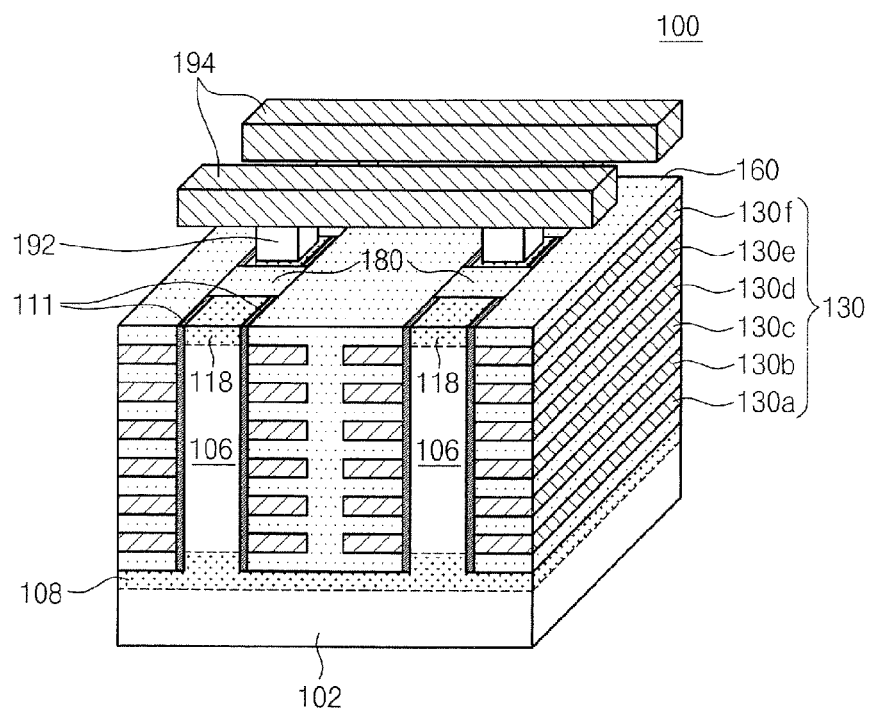
Figure 20:
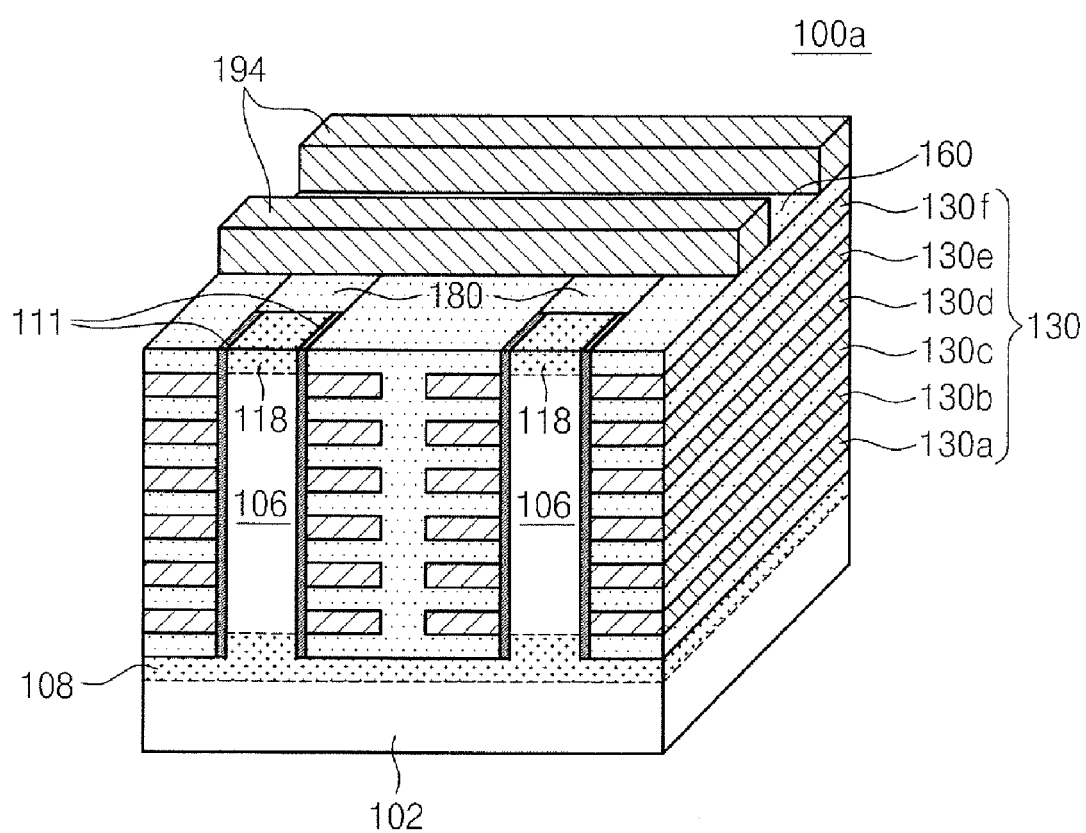

Referring to FIG. 2N, a plug 192 electrically connected to the active pillar 106 is formed and a conductive layer 194 electrically connected to the plug 192 is formed. The plug 192 and the conductive layer 194 may be formed by depositing polysilicon or metal (e.g., tungsten, aluminum, copper, titanium or the like). The conductive layer 194 may be used as a bit line connected to a plurality of active pillars 106 by the medium of the plug 192. The plug 192 may be electrically connected to the drain 118 of the active substrate 106. The conductive layer 194 may extend in a direction perpendicular to an extension direction of the gate group 130. The nonvolatile memory device 100 in accordance with some embodiments of the present invention may be embodied by a process including a series of courses described above. FIG. 1A is the nonvolatile memory device 100 of some embodiments from which the insulating layers 160 and 180 are removed.

Referring to FIG. 2O, according these embodiments, a nonvolatile memory device 100a may be embodied by forming the conductive layer 194 directly and electrically connected to the active pillar 106. The conductive layer 194 may be used as a bit line directly and electrically connected to the drain 118 of the active pillar 106.

FIGS. 3A through 3F are perspective views illustrating processing steps in the fabrication of nonvolatile memory devices in accordance with some embodiments of the present invention. The method of manufacturing the nonvolatile memory device of FIGS. 3A through 3F is similar to the method of manufacturing the nonvolatile memory device described with respect to FIGS. 2A through 2O. Therefore, the descriptions of common features are omitted, while any new or different features are described in further detail below.

Figure 3A:
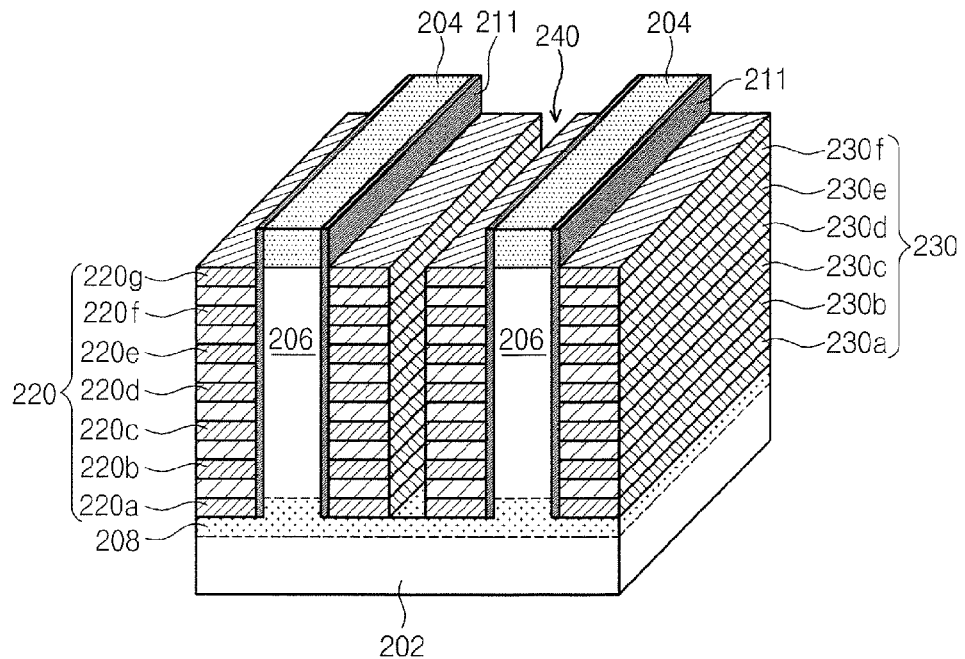
FIGS. 3A through 3F are perspective views illustrating processing steps in the fabrication of nonvolatile memory devices in accordance with some embodiments of the present invention.

Referring to FIG. 3A, a sacrificial layer group 220 and a conductive layer group 230 are formed between active pillars 206 and the sacrificial layer group 220 and the conductive layer group 230 are patterned to form a trench 240 by performing a process similar to the process described with reference to FIGS. 2A through 2G. For example, as depicted in FIGS. 2A and 2B, a bulk substrate 202 comprised of p-type single crystalline silicon is patterned by a dry etching using a hard mask 204 as an etching mask to form an active pillar 206 perpendicular to the semiconductor substrate 202. As depicted in FIG. 2C, an n-type source 208 may be formed in the semiconductor substrate 202 by an ion implantation process. As depicted in FIG. 2D, an insulating layer (ONO) is deposited and as depicted in FIG. 2E, the insulating layer is etched using a dry etching to form a charge storage layer 211 at a side of active pillar 206. As depicted in FIG. 2F, the sacrificial layer group 220 is formed by an epitaxial growth of silicon/germanium and the conductive layer group 230 is formed by an epitaxial growth of single crystalline silicon doped with an impurity. As depicted in FIG. 2G, the sacrificial layer group 220 and the conductive layer group 230 may be patterned to form the trench 240.

Figure 3B:
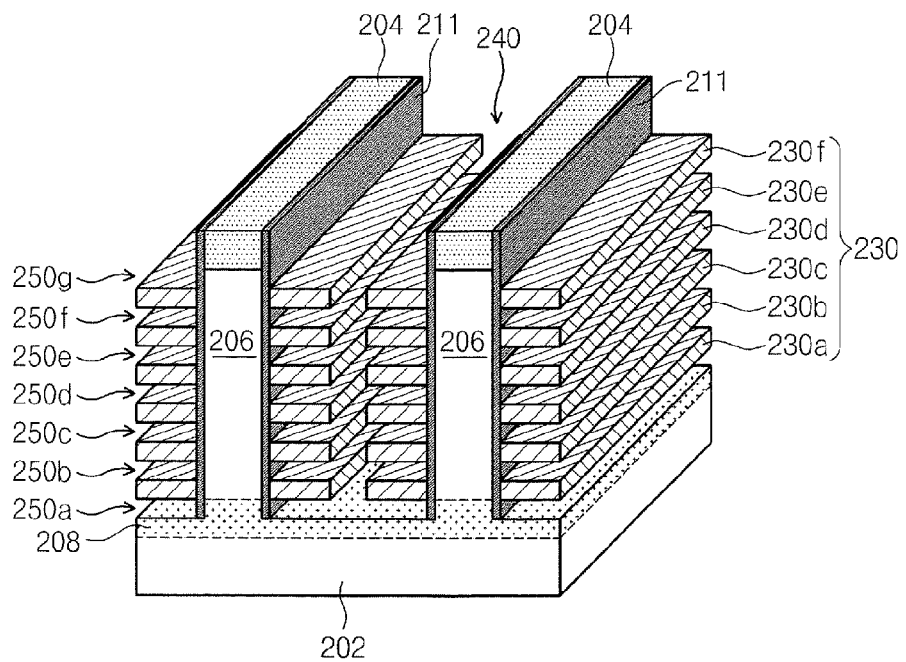

Referring to FIG. 3B, the sacrificial layer group 220 is removed to expose the charge storage layer 211 by performing a process similar to the process described with reference to FIG. 2H. For example, the sacrificial layer group 220 is removed by providing an etchant through the trench 240 and a plurality of gate interlayer regions 250a through 250g exposing the charge storage layer 211 may be formed.

Figure 3C:
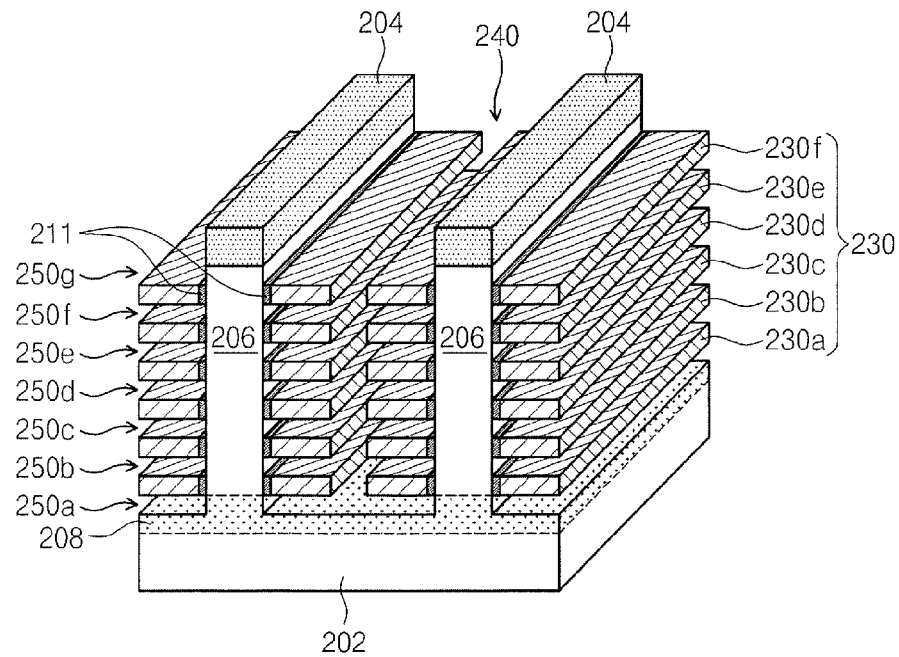

Referring to FIG. 3C, the charge storage layer 211 exposed through the plurality of gate interlayer regions 250a through 250g may be selectively removed by performing a wet etching using an etchant capable of selectively etching the insulator with respect to silicon. For example, hydrofluoric acid, phosphoric acid or a mixture including hydrofluoric acid, phosphoric acid may be adopted as an etchant. At this time, the charge storage layer 211 may remain between the conductive layer group 230 and the active pillar 206 using the conductive layer group 230 as a mask. As a result, the charge storage layer (211 of FIG. 3B) having a plate shape may be divided into a plurality of charge storage layers 211 having a line shape.

Figure 3D:
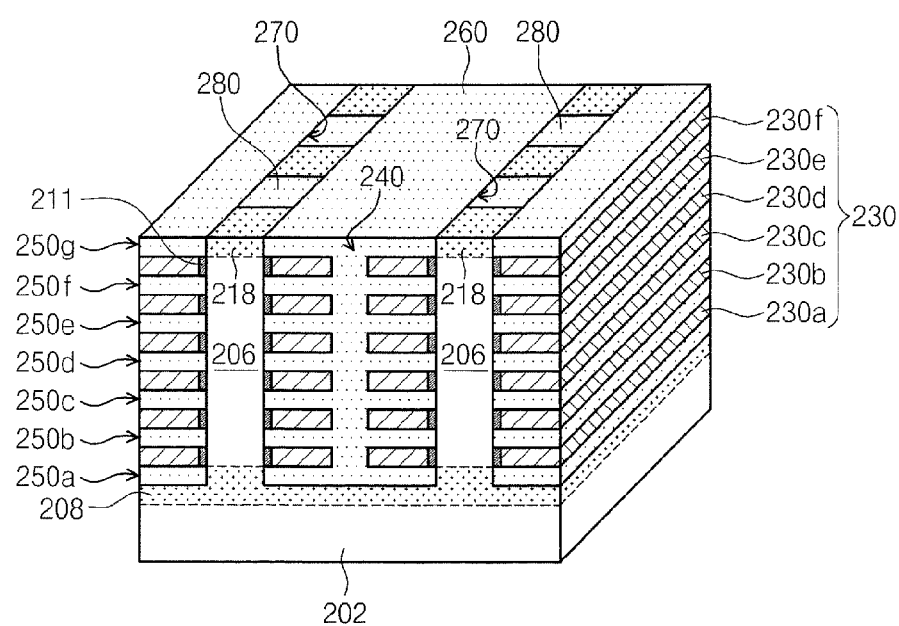

Referring to FIG. 3D, the active pillar 206 divided into a dot shape is formed by an insulating layer 280 filling an isolation region 270 by performing a process similar to the process described by making reference to FIGS. 2I through 2M. For example, as depicted in FIG. 2I, an insulating layer 260 filling the trench 240 and the gate interlayer region 250a through 250g may be formed by depositing an insulator (e.g., a silicon oxide layer) using a chemical vapor deposition (CVD). As depicted in FIG. 2J, the hard mask 204 is removed by a chemical mechanical polishing (CMP) and as depicted in FIG. 2K, a p-type drain 218 may be formed on an upper portion of active pillar 206 by an ion implantation process. As depicted in FIG. 2I, a plurality of isolation regions 270 vertically penetrating the active pillar 206 may be formed by performing a dry etching on the active pillar 206. As depicted in FIG. 2M, the insulating layer 280 filling the isolation region 270 may be formed by depositing an insulator (e.g., a silicon oxide layer).

Figure 3E:
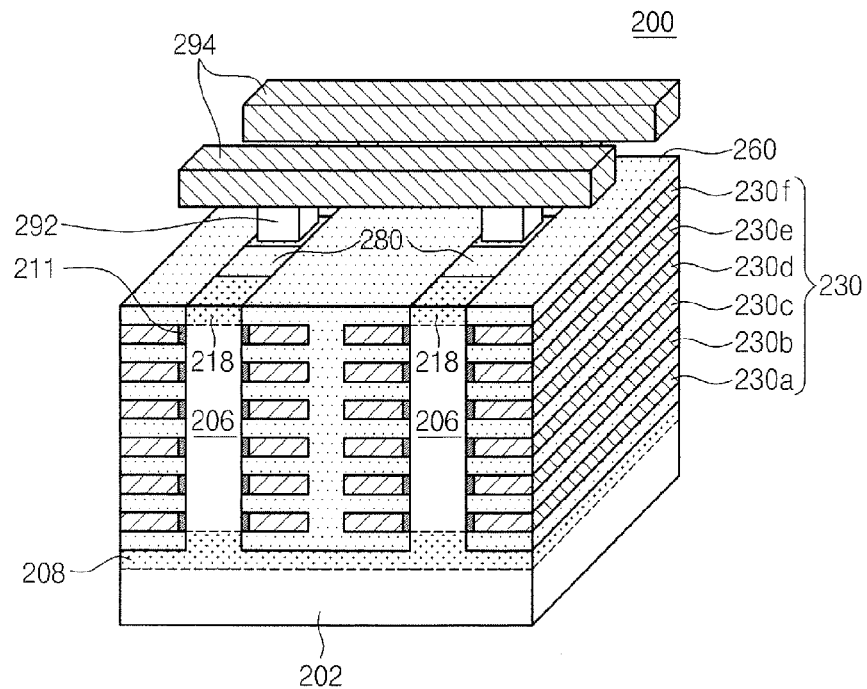
Figure 3F:
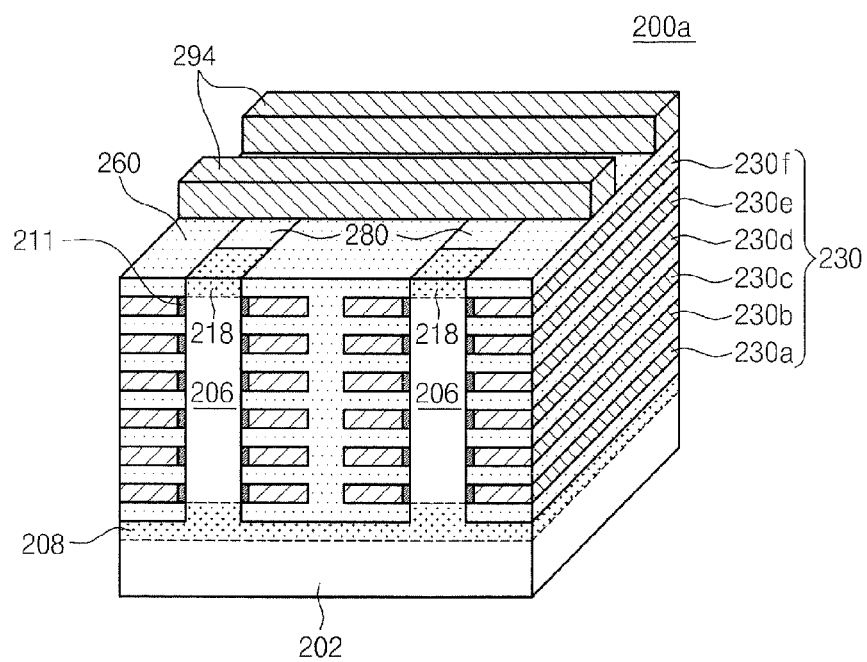

Referring to FIG. 3E, a plug 292 electrically connected to the drain 218 may be formed and a conductive layer 294, that is, a bit line electrically connected to the plug 292 may be formed by performing a process similar to the process described with reference to FIG. 2N. As a result, the nonvolatile memory device 200 including the divided charge storage layer 211 may be embodied. FIG. 1C is the nonvolatile memory device 200 from which the insulating layers 260 and 280 are removed.

Referring to FIG. 3F, for another example, as depicted in FIG. 2O, a nonvolatile memory device 200a may be embodied by forming the conductive layer directly connected to the drain 218.

FIGS. 4A through 4L are perspective views illustrating processing steps in the fabrication of nonvolatile memory devices in accordance with some embodiments of the present invention. The method of manufacturing the nonvolatile memory device of FIGS. 4A through 4L is similar to the method of manufacturing the nonvolatile memory device described with respect to FIGS. 2A through 2O. Therefore, the descriptions of common features are omitted, while any new or different features are described in further detail below.

Figure 4A:
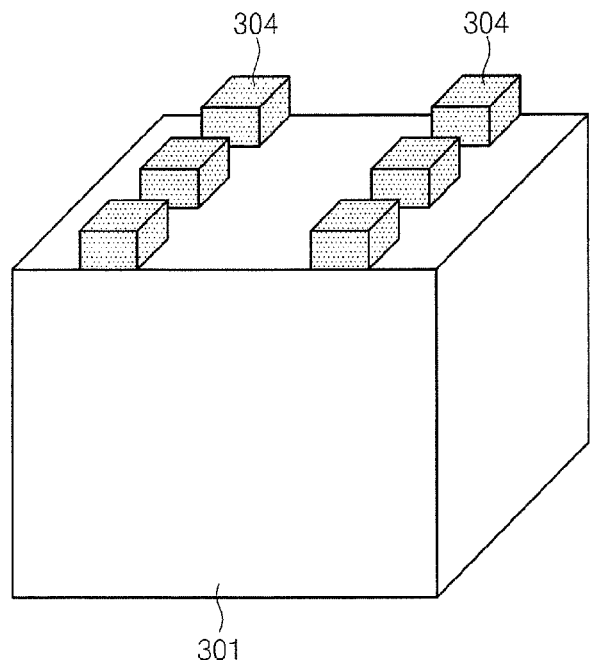
FIGS. 4A through 4L are perspective views illustrating processing steps in the fabrication of nonvolatile memory devices in accordance with some embodiments of the present invention.

Referring to FIG. 4A, a hard mask 304 is formed on a bulk substrate 301. The bulk substrate 301 may be formed of p-type single crystalline silicon. The hard mask 304 may be formed to have a dot shape by depositing a silicon nitride layer and then patterning the silicon nitride layer.

Figure 4B:
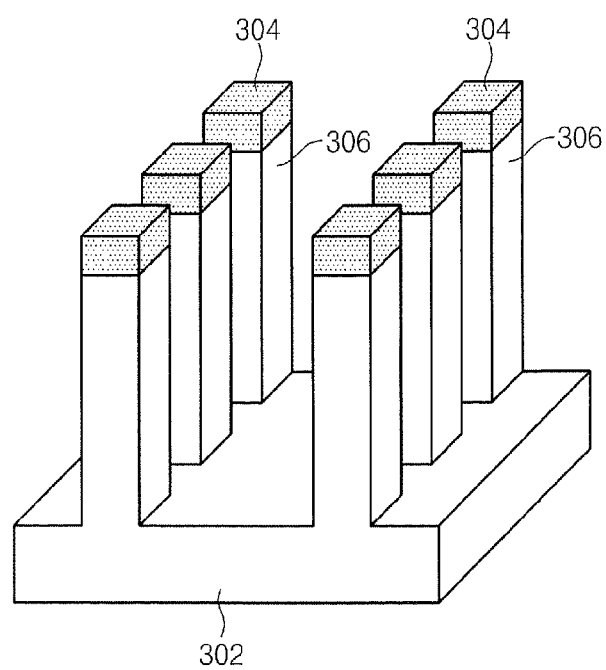

Referring to FIG. 4B, the bulk substrate 301 is patterned by a dry etching using the hard mask 304 as a mask to form a plurality of active pillars 306 perpendicular to a semiconductor substrate 302. The active pillar 306 may be formed of p-type single crystalline silicon like the semiconductor substrate 302.

Figure 4C:
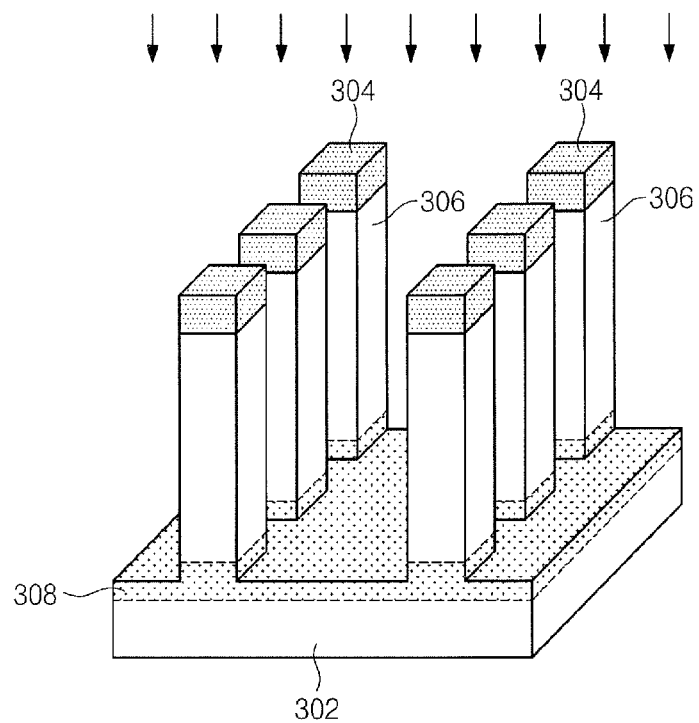

Referring to FIG. 4C, a source 308 may be formed on the semiconductor substrate 302 by selectively performing an ion implantation process. The source 308 may be doped with a conductivity type (e.g., n-type) different from the semiconductor substrate 302. The source 308 occupies a bottom surface of semiconductor substrate 302 and may further occupy a lower portion of active pillar 306. After an ion implantation process, an annealing process is further performed to accelerate a diffusion of an impurity.

Figure 4D:
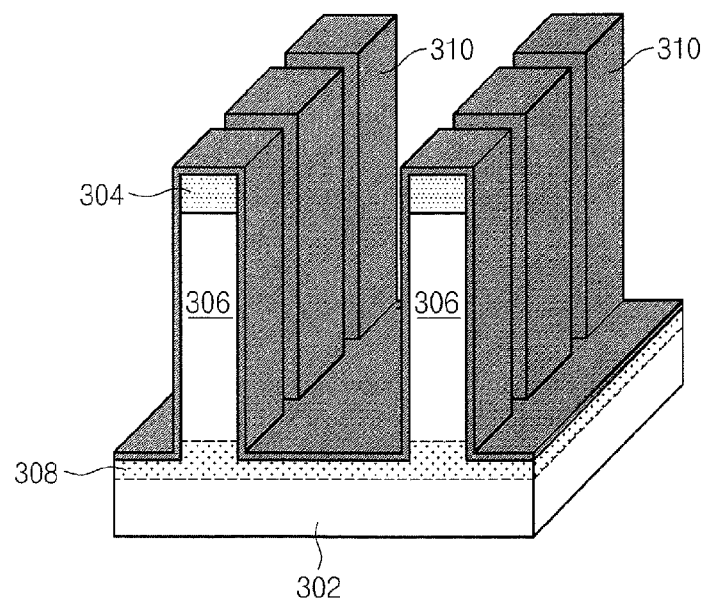

Referring to FIG. 4D, an insulating layer 310 is formed. The insulating layer 310 may be formed by depositing an insulator using a chemical vapor deposition or an atomic layer deposition so that a deposition thickness of the insulating layer 310 is uniform. Since the insulating layer 310 is used as a charge storage layer, it is desirable that the insulating layer 310 can trap charges. For example, the insulating layer 310 may be formed by depositing an ONO layer that a silicon nitride is interposed between the silicon oxide layers.

Figure 4E:
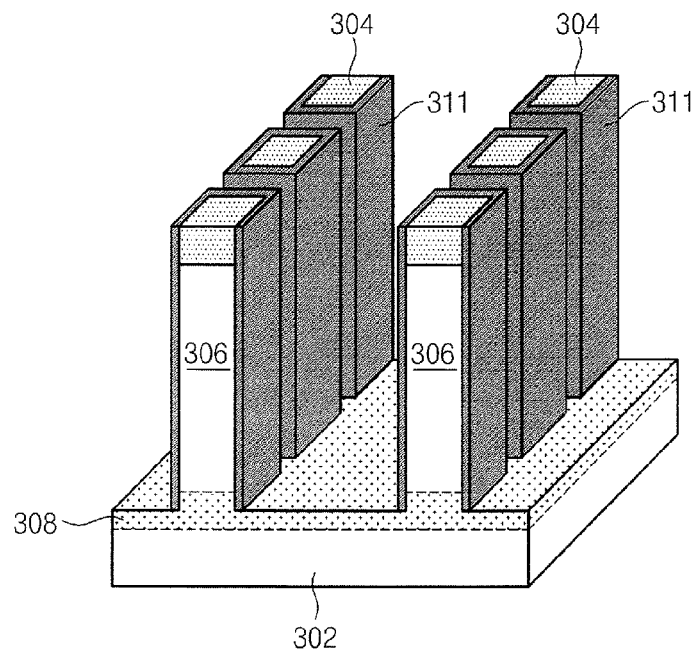

Referring to FIG. 4E, the insulating layer 310 is etched using a dry etching so that the insulating layer 311 (hereinafter it is referred to as charge storage layer) remains on a side surface of active pillar 306. Top surfaces of source 308 and hard mask 304 may be exposed by a dry etching of the insulating layer 310. The charge storage layer 311 may have a shape surrounding a side of active pillar 306.

Figure 4F:
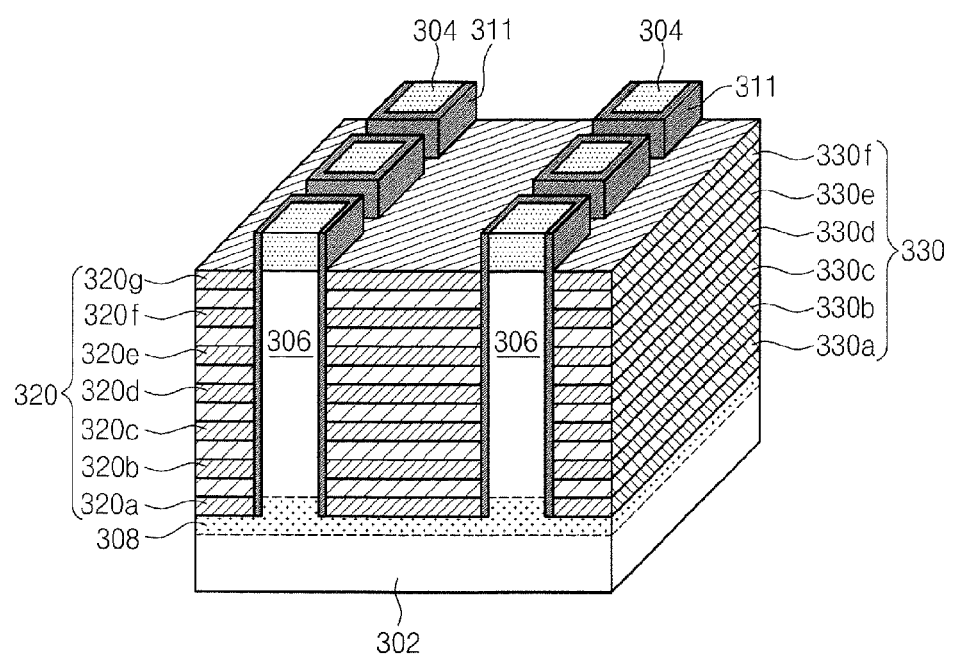

Referring to FIG. 4F, a sacrificial layer group 320 and a conductive layer group 330 are formed. The sacrificial layer group 320 and the conductive layer group 330 have an etching selectivity and may be formed to have a plate shape. The sacrificial layer group 320 may be formed to have a plurality of sacrificial layers 320a through 320g of a plate shape by epitaxially growing silicon/germanium or silicon/carbon. The conductive layer group 330 may be formed to have a plurality of conductive layers 330a through 330f of a plate shape by epitaxially growing single crystalline silicon doped with an n-type impurity or a p-type impurity. The plurality of sacrificial layers 320a through 320g and the plurality of conductive layers 330a through 330f may be alternatively grown to have a sandwich structure.

Figure 4G:
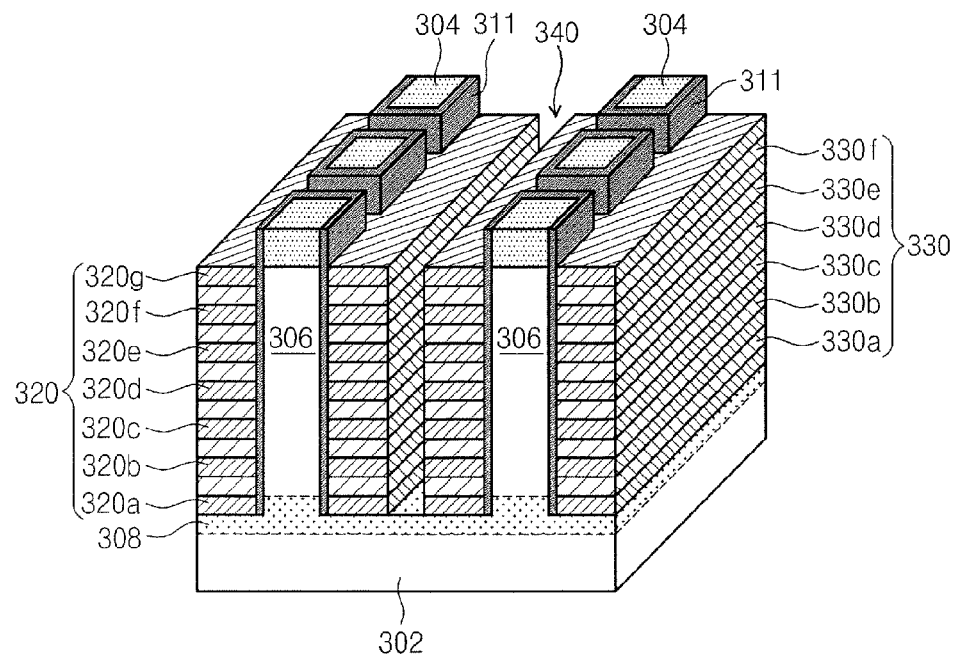

Referring to FIG. 4G, the sacrificial layer group 320 and the conductive layer group 330 are patterned to form a trench 340 exposing the semiconductor substrate 302. It is desirable to adopt a dry etching so that an etch profile of the trench 340 becomes vertical. The trench 340 may be formed to have a line shape extending in a specific direction. Respective side surfaces of sacrificial layer group 320 and conductive layer group 330 may be exposed by the trench 340.

Figure 4H:
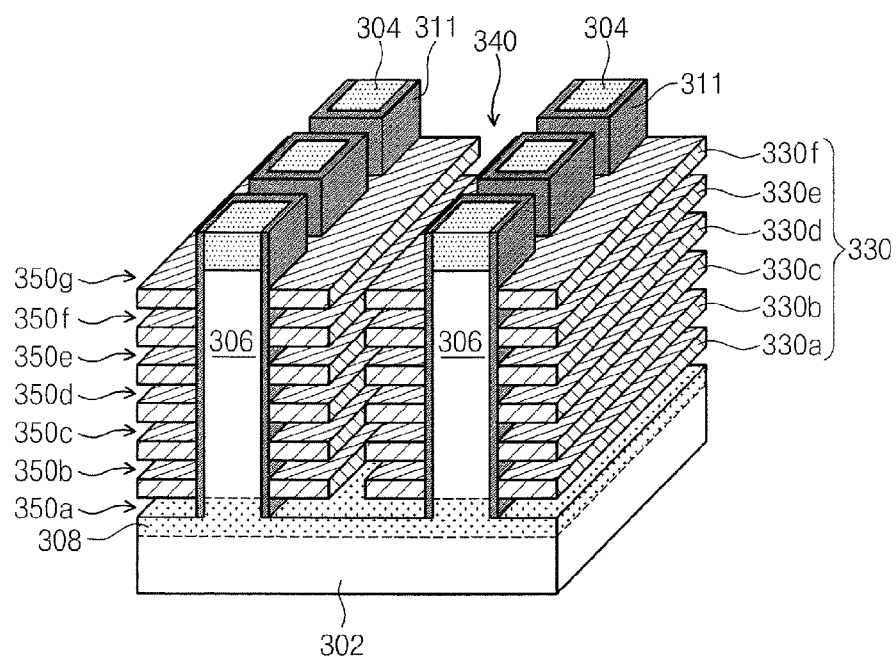

Referring to FIG. 4H, the sacrificial layer group (320 of FIG. 4G) of which a side surface is exposed by the trench 340 is removed. The sacrificial layer group 320 may be removed by a wet etching using an etchant capable of selectively removing the sacrificial layers 320a through 320g with respect to the conductive layers 330a through 330f. An etchant provided to the trench 340 attacks a side surface of sacrificial layer group 320 exposed by the trench 340, so the sacrificial layer group 320 may selectively removed. As a result, the conductive layer group 330 may remain and a plurality of gate interlayer regions 350a through 350g exposing the charge storage layer 311 may be formed on and under the conductive layers 330a through 330f, respectively. The conductive layers 330a through 330f may have a plate shape being separated from each other up and down and extending in a specific direction. The active pillar 306 may have a vertical pillar shape penetrating the conductive layer group 330 of a plate shape.

Figure 4I:
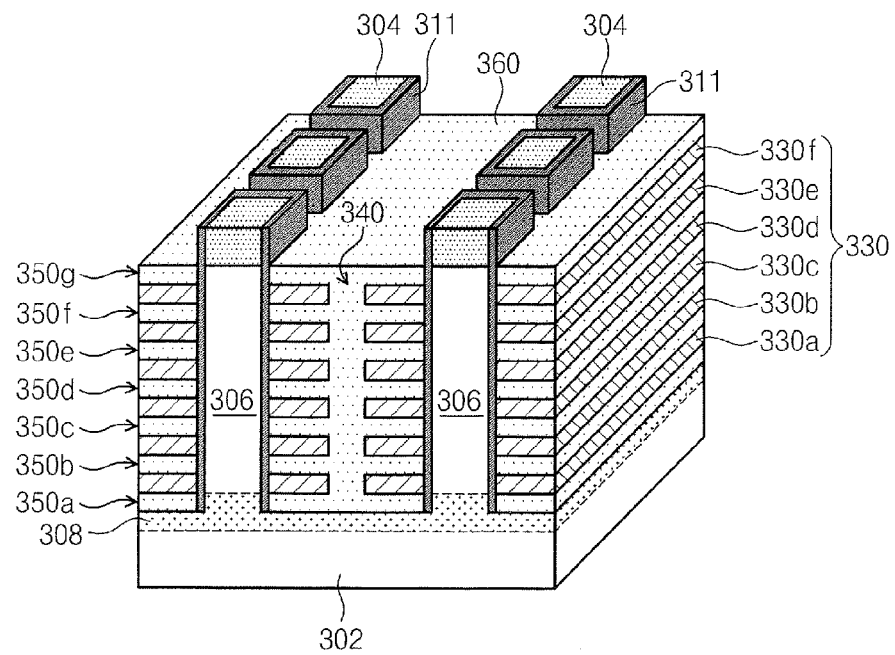

Referring to FIG. 4I, an insulating layer 360 filling the trench 340 and the gate interlayer regions 350a through 350g is formed. The insulating layer 360 may be formed by depositing a silicon oxide layer ($SiO_2$), a silicon nitride layer (SiN or $Si_3N_4$) or a silicon oxynitride layer (SiON) using a chemical vapor deposition (CVD).

Figure 4J:
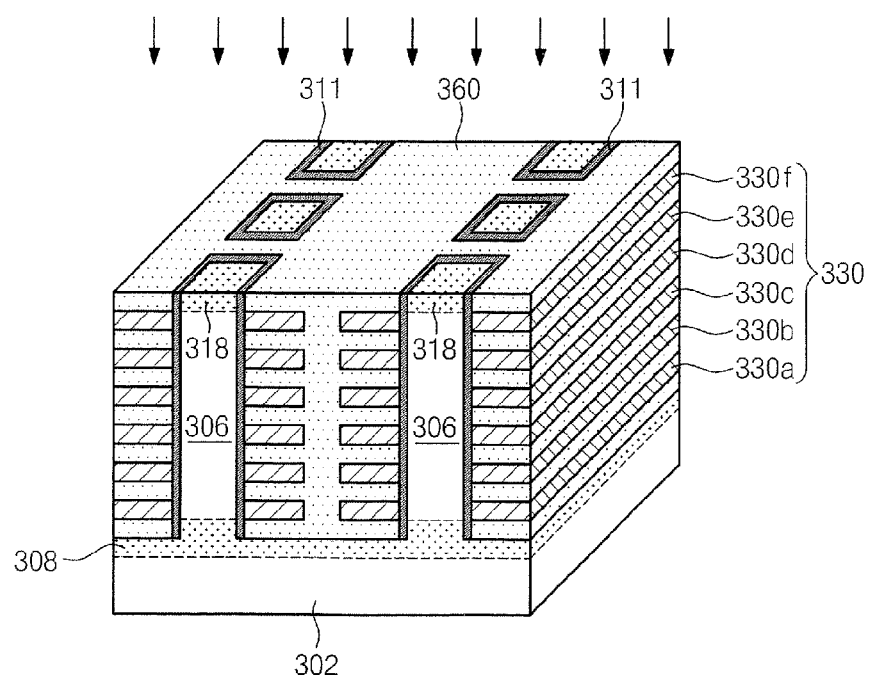

Referring to FIG. 4J, the hard mask 304 is removed using a chemical mechanical polishing (CMP). In this case, the charge storage layer 311 may also be removed by a chemical mechanical polishing (CMP). A top surface of active pillar 306 may be exposed by a removal of the hard mask 304. According to some embodiments of the present invention, since the active pillar 306, as described with reference to FIG. 4B, is already formed to have a dot shape, it does not need a process of dividing the active pillar 306 described with reference to FIGS. 2L and 2M. An ion implantation or an ion implantation together with an annealing may be performed on a top surface of selectively exposed active pillar 306 to form a drain 318.

Figure 4K:
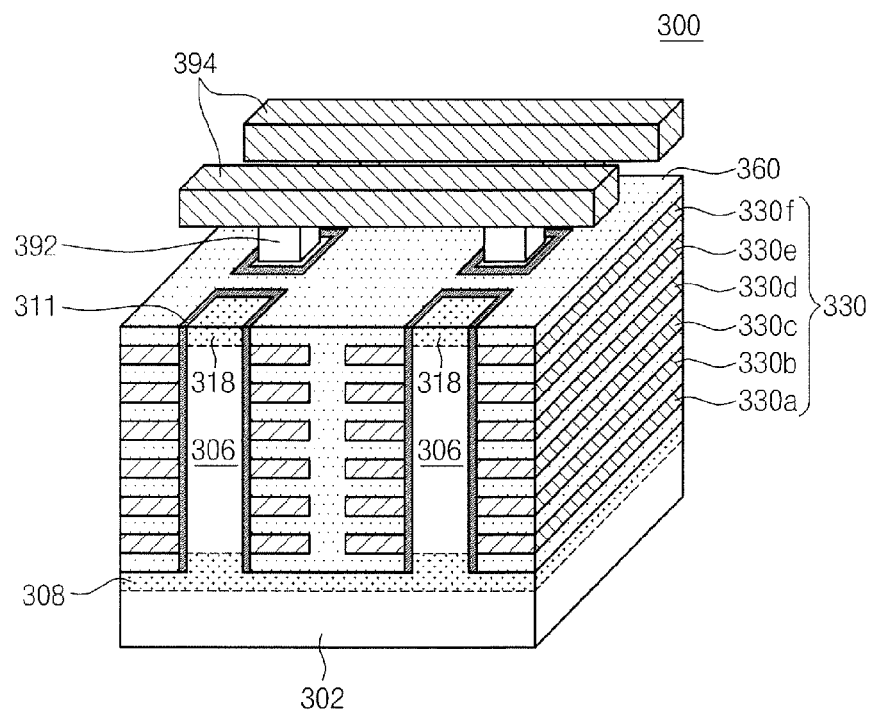

Referring to FIG. 4K, a plug 392 electrically connected to the drain 318 may be formed and a conductive layer 394, that is, a bit line electrically connected to the plug 392 may be formed. As a result, the nonvolatile memory device 300 may be embodied. FIG. 1E is the nonvolatile memory device 400 from which the insulating layers 460 is removed.

Figure 4L:
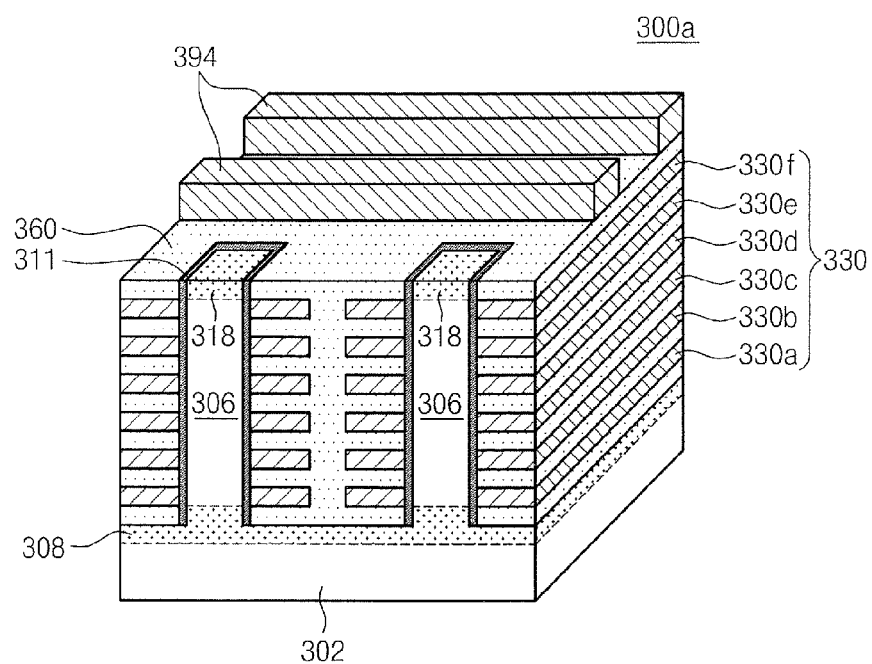

Referring to FIG. 4L, a nonvolatile memory device 300a may be embodied by forming the conductive layer 394 directly and electrically connected to the active pillar 306 without forming a plug.

In these embodiments, the manufacturing method described by making reference to FIGS. 3A through 3F may be identically or similarly applied. According to that, as depicted in FIG. 1E, in the nonvolatile memory device 400, the charge storage layer 411 is limited between the conductive layer group 430 and the active pillar 406 and may be formed to have a ring shape. The rest except that may be identical to or similar to those described by making reference to FIGS. 4A through 4L.

Figure 5A:
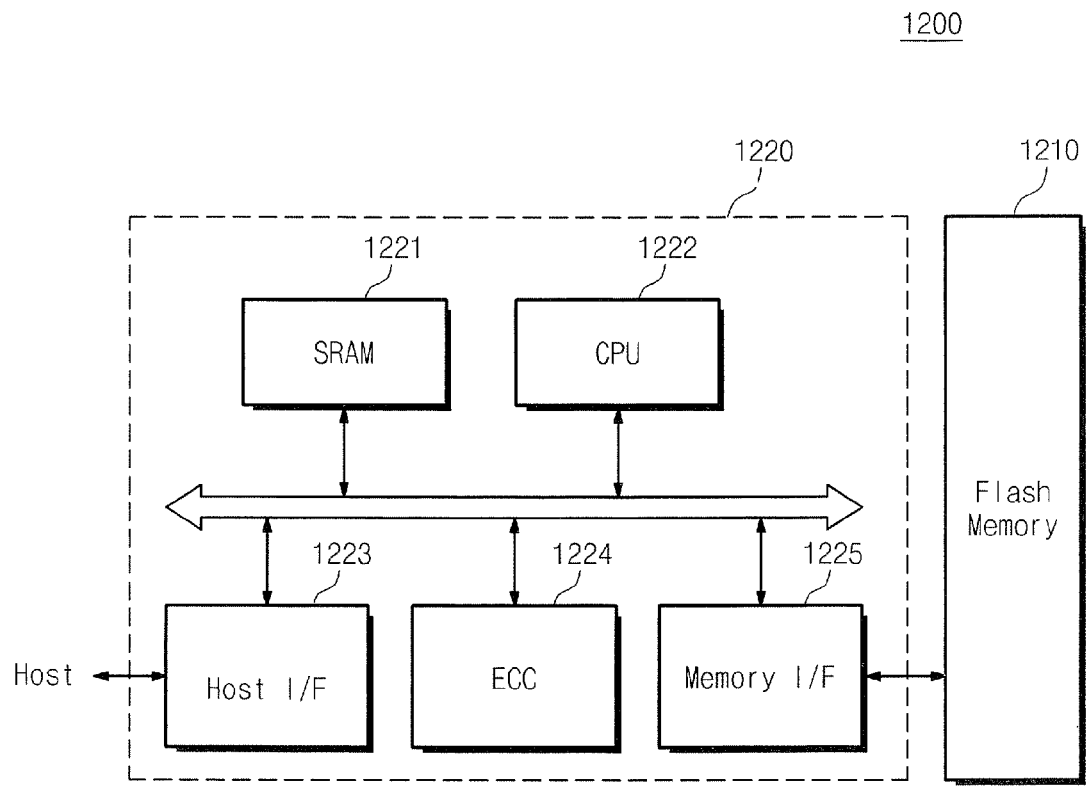
FIGS. 5A and 5B are schematic views of equipments applying a nonvolatile memory device in accordance with some embodiments of the present invention.

FIG. 5A is a block diagram of a memory card including a nonvolatile memory device in accordance with some embodiments of the present invention.

Referring to FIG. 5A, a memory card 1200 provides mass data storage capacity and includes a flash memory 1210. The flash memory 1210 may include a nonvolatile memory device in accordance with some embodiments of the present invention described above, for example, a NAND flash memory device.

The memory card 1200 may include a memory controller 1220 controlling all the data exchanges between a host and the flash memory controller 1220. A SRAM 1221 may be used as an operation memory of a central processing unit (CPU) 1220. A host interface 1223 may include a data exchange protocol of the host connected to the memory card 1200. An error correction code (ECC) 1224 can detect and correct errors included in data readout from the flash memory 1210. A memory interface 1225 interfaces with the flash memory 1210. The central processing unit (CPU) 1222 performs all the control operations for an exchange of data of the memory controller 1220. Although not depicted in a drawing, the memory card 1200 may further include a ROM storing code data for interfacing with the host.

Figure 5B:
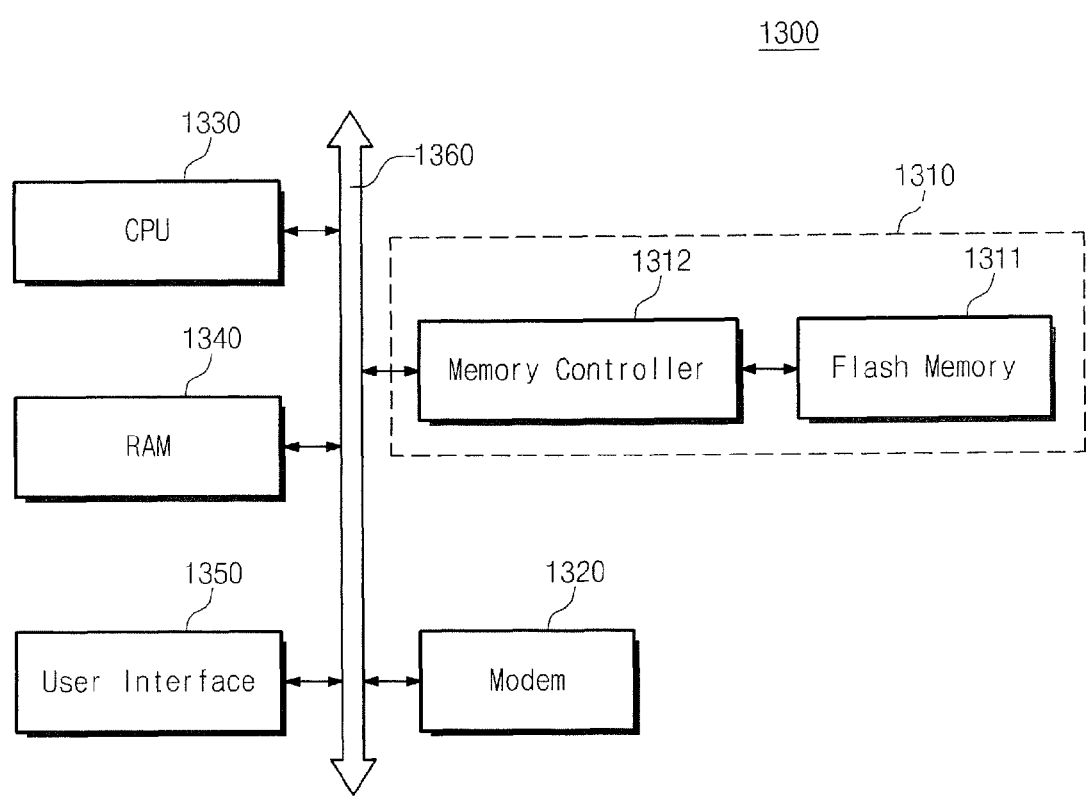

FIG. 5B is a block diagram of a data processing system in accordance with some embodiments of the present invention. Referring to FIG. 5B, a data processing system 1300 in accordance with embodiments of the present invention may include a flash memory system 1310 including the nonvolatile memory device described above, for example, a flash memory device (e.g., a NAND flash memory device). The data processing system 1300 may include a mobile device or a computer.

For one example, the data processing system 1300 may include the flash memory system 1310 and a modem 1320, a central processing unit (CPU) 1330, a RAM 1340 and a user interface 1350 that are electrically connected to a system bus 1360 respectively. The flash memory system 1310 may store data treated by the central processing unit (CPU) 1330 or data inputted from an external device.

The data processing system 1300 may be provided as a memory card, a solid state disk (SSD), a camera image sensor and an application chipset. For one example, the flash memory system 1310 may be comprised of a solid state disk (SSD) and in this case, the data processing system 1300 may stably and reliably store huge amounts of data in the flash memory system 1310.

The flash memory or the flash memory system in accordance with the present invention may be mounted by various types of packages. For example, the flash memory or the flash memory system in accordance with the present invention may be packaged by methods such as PoP (package on package), ball grid array (BGA), chip scale package (CSP), plastic leaded chip carrier (PLCC), plastic dual in-line package (PDIP), multi chip package (MCP), wafer-level fabricated package (WFP), wafer-level processed stack package (WSP), die on waffle package, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP).

According to the present invention, since a substrate is patterned to form an active pillar before forming a gate, a difference of a cross section area in accordance with a height may not exist, so a cell distribution characteristic can be improved. Together with that, since an active pillar can be comprised of single crystalline silicon like the substrate, an occurrence of a leakage current is prevented and a capacity of a current operation is improved, thereby improving an operation speed. Besides, a charge storage layer is divided according to each gate, so an operation error can be substantially reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:
 a substrate comprising a single crystalline semiconductor;
 an active pillar formed by patterning the substrate, the active pillar comprising the single crystalline semiconductor;
 a plurality of gates vertically deposited on the substrate and using the active pillar as a channel; and
 a charge storage layer disposed on a side surface of the active pillar.

2. The nonvolatile memory device of claim 1, wherein the plurality of gates comprises any one of a line shape that is parallel to the substrate and crosses a side surface of active pillar and a plate shape that are parallel to the substrate and the active pillar vertically penetrates.

3. The nonvolatile memory device of claim 1, wherein the charge storage layer comprises any one of an undivided shape that the charge storage layer is not divided according to the plurality of gates and a divided shape that the charge storage layer is divided according to the plurality of gates.

* * * * *